(12) United States Patent
Wong et al.

(10) Patent No.: US 7,068,480 B2
(45) Date of Patent: Jun. 27, 2006

(54) ARC DETECTION USING LOAD RECOGNITION, HARMONIC CONTENT AND BROADBAND NOISE

(75) Inventors: Kon B. Wong, Cedar Rapids, IA (US); Gary W. Scott, Mt. Vernon, IA (US)

(73) Assignee: Square D Company, Palatine, IL (US)

( * ) Notice: Subject to any disclaimer, the term of this patent is extended or adjusted under 35 U.S.C. 154(b) by 72 days.

(21) Appl. No.: 10/107,621

(22) Filed: Mar. 27, 2002

(65) Prior Publication Data

US 2003/0072113 A1    Apr. 17, 2003

Related U.S. Application Data

(63) Continuation-in-part of application No. 09/981,603, filed on Oct. 17, 2001.

(51) Int. Cl.
*H02H 9/08* (2006.01)

(52) U.S. Cl. .......................... 361/42; 361/43

(58) Field of Classification Search ............ 361/42–50, 361/54
See application file for complete search history.

(56) References Cited

U.S. PATENT DOCUMENTS

| | | | |
|---|---|---|---|
| 2,808,566 A | 10/1957 | Douma | 324/127 |
| 2,832,642 A | 4/1958 | Lennox | 299/132 |
| 2,898,420 A | 8/1959 | Kuze | 200/87 |
| 3,471,784 A | 10/1969 | Arndt et al. | 324/126 |
| 3,538,241 A | 11/1970 | Rein | 174/143 |
| 3,588,611 A | 6/1971 | Lambden et al. | 317/31 |
| 3,600,502 A | 8/1971 | Wagenaar et al. | 174/143 |
| 3,622,872 A | 11/1971 | Boaz et al. | 324/52 |
| 3,660,721 A | 5/1972 | Baird | 361/55 |
| 3,684,955 A | 8/1972 | Adams | 324/72 |
| 3,716,757 A | 2/1973 | Rodriguez | 317/40 |
| 3,746,930 A | 7/1973 | Van Best et al. | 317/31 |
| 3,775,675 A | 11/1973 | Freeze et al. | 324/51 |
| 3,812,337 A | 5/1974 | Crosley | 235/153 AC |
| 3,858,130 A | 12/1974 | Misencik | 335/18 |
| 3,869,665 A | 3/1975 | Kenmochi et al. | 324/72 |
| 3,878,460 A | 4/1975 | Nimmersjo | 324/52 |
| 3,911,323 A | 10/1975 | Wilson et al. | 317/18 |
| 3,914,667 A | 10/1975 | Waldron | 317/36 |
| 3,932,790 A | 1/1976 | Muchnick | 317/18 D |
| 3,939,410 A | 2/1976 | Bitsch et al. | 324/72 |

(Continued)

FOREIGN PATENT DOCUMENTS

CA    2256208    6/1999

(Continued)

OTHER PUBLICATIONS

Antonio N. Paolantonio, P.E., Directional Couplers, R.F. Design, Sep./Oct. 1979, pp. 40-49.

(Continued)

*Primary Examiner*—Brian Sircus
*Assistant Examiner*—Danny Nguyen

(57) ABSTRACT

A method of determining whether arcing is present in an electrical circuit includes sensing a change in current in the circuit and developing a corresponding input signal, analyzing the input signal to determine the presence of broadband noise in a predetermined range of frequencies, and producing a corresponding output signal, and processing the input signal and the output signal in a predetermined fashion to determine whether an arcing fault is present in the circuit. The processing includes determining a type of load connected to the electrical circuit, based at least in part upon the input signal and the output signal.

70 Claims, 37 Drawing Sheets

U.S. PATENT DOCUMENTS

| | | | | |
|---|---|---|---|---|
| 4,052,751 A | 10/1977 | Shepard | | 361/50 |
| 4,074,193 A | 2/1978 | Kohler | | 324/126 |
| 4,081,852 A | 3/1978 | Coley et al. | | 361/45 |
| 4,087,744 A | 5/1978 | Olsen | | 324/51 |
| 4,115,828 A | 9/1978 | Rowe et al. | | 361/1 |
| 4,156,846 A | 5/1979 | Harrold et al. | | 324/158 |
| 4,166,260 A | 8/1979 | Gillette | | 335/20 |
| 4,169,260 A | 9/1979 | Bayer | | 340/562 |
| 4,214,210 A | 7/1980 | O'Shea | | 455/282 |
| 4,233,640 A | 11/1980 | Klein et al. | | 361/44 |
| 4,245,187 A | 1/1981 | Wagner et al. | | 324/54 |
| 4,251,846 A | 2/1981 | Pearson et al. | | 361/30 |
| 4,264,856 A | 4/1981 | Frierdich et al. | | 322/25 |
| RE30,678 E | 7/1981 | Van Zeeland et al. | | 361/44 |
| 4,316,187 A | 2/1982 | Spencer | | 340/664 |
| 4,344,100 A | 8/1982 | Davidson et al. | | 361/45 |
| 4,354,154 A | 10/1982 | Olsen | | 324/51 |
| 4,356,443 A | 10/1982 | Emery | | 324/51 |
| 4,358,809 A | 11/1982 | Blok | | 361/46 |
| 4,378,525 A | 3/1983 | Burdick | | 324/127 |
| 4,387,336 A | 6/1983 | Joy et al. | | 324/51 |
| 4,459,576 A | 7/1984 | Fox et al. | | 336/84 |
| 4,466,071 A | 8/1984 | Russell, Jr. | | 364/492 |
| 4,477,855 A | 10/1984 | Nakayama et al. | | 361/54 |
| 4,559,491 A | 12/1985 | Saha | | 324/52 |
| 4,587,588 A | 5/1986 | Goldstein | | 361/54 |
| 4,589,052 A | 5/1986 | Dougherty | | 361/94 |
| 4,590,355 A | 5/1986 | Nomura et al. | | 219/125.12 |
| 4,616,200 A | 10/1986 | Fixemer et al. | | 335/35 |
| 4,639,817 A | 1/1987 | Cooper et al. | | 361/62 |
| 4,642,733 A | 2/1987 | Schacht | | |
| 4,644,439 A | 2/1987 | Taarning | | 361/87 |
| 4,652,867 A | 3/1987 | Masot | | 340/638 |
| 4,658,322 A | 4/1987 | Rivera | | 361/37 |
| 4,697,218 A | 9/1987 | Nicolas | | 633/882 |
| 4,702,002 A | 10/1987 | Morris et al. | | 29/837 |
| 4,707,759 A | 11/1987 | Bodkin | | 831/642 |
| 4,771,355 A | 9/1988 | Emery et al. | | 361/33 |
| H536 H | 10/1988 | Strickland et al. | | 324/456 |
| H538 H | 11/1988 | Betzold | | 89/134 |
| 4,792,899 A | 12/1988 | Miller | | 364/200 |
| 4,810,954 A | 3/1989 | Fam | | 324/142 |
| 4,816,958 A | 3/1989 | Belbel et al. | | 361/93 |
| 4,833,564 A | 5/1989 | Pardue et al. | | 361/93 |
| 4,835,648 A | 5/1989 | Yamauchi | | 361/14 |
| 4,839,600 A | 6/1989 | Kuurstra | | 324/127 |
| 4,845,580 A | 7/1989 | Kitchens | | 361/91 |
| 4,847,719 A | 7/1989 | Cook et al. | | 361/13 |
| 4,853,818 A | 8/1989 | Emery et al. | | 361/33 |
| 4,858,054 A | 8/1989 | Franklin | | 361/57 |
| 4,866,560 A | 9/1989 | Allina | | 361/104 |
| 4,882,682 A | 11/1989 | Takasuka et al. | | 364/507 |
| 4,893,102 A | 1/1990 | Bauer | | 335/132 |
| 4,901,183 A | 2/1990 | Lee | | 361/56 |
| 4,922,368 A | 5/1990 | Johns | | 361/62 |
| 4,922,492 A | 5/1990 | Fasang et al. | | 371/22.1 |
| 4,931,894 A | 6/1990 | Legatti | | 361/45 |
| 4,939,495 A | 7/1990 | Peterson et al. | | 337/79 |
| 4,949,214 A | 8/1990 | Spencer | | 361/95 |
| 4,969,063 A | 11/1990 | Scott et al. | | 361/93 |
| 5,010,438 A | 4/1991 | Brady | | 361/56 |
| 5,012,673 A | 5/1991 | Takano et al. | | 73/118.1 |
| 5,032,744 A | 7/1991 | Wai Yeung Liu | | 307/355 |
| 5,047,724 A | 9/1991 | Boksiner et al. | | 324/520 |
| 5,051,731 A | 9/1991 | Guim et al. | | 340/638 |
| 5,063,516 A * | 11/1991 | Jamoua et al. | | 701/114 |
| 5,107,208 A | 4/1992 | Lee | | 324/158 |
| 5,117,325 A | 5/1992 | Dunk et al. | | 361/93 |
| 5,121,282 A | 6/1992 | White | | 361/42 |
| 5,166,861 A | 11/1992 | Krom | | 361/379 |
| 5,168,261 A | 12/1992 | Weeks | | |
| 5,179,491 A | 1/1993 | Runyan | | 361/45 |
| 5,185,684 A | 2/1993 | Beihoff et al. | | 361/45 |
| 5,185,685 A | 2/1993 | Tennies et al. | | 361/45 |
| 5,185,686 A | 2/1993 | Hansen et al. | | 361/45 |
| 5,185,687 A | 2/1993 | Beihoff et al. | | 361/45 |
| 5,206,596 A | 4/1993 | Beihoff et al. | | 324/536 |
| 5,208,542 A | 5/1993 | Tennies et al. | | 324/544 |
| 5,223,795 A | 6/1993 | Blades | | 324/536 |
| 5,224,006 A | 6/1993 | MacKenzie et al. | | 361/45 |
| 5,233,511 A | 8/1993 | Bilas et al. | | 364/146 |
| 5,257,157 A | 10/1993 | Epstein | | 361/111 |
| 5,280,404 A | 1/1994 | Ragsdale | | 361/113 |
| 5,283,708 A | 2/1994 | Waltz | | 361/93 |
| 5,286,933 A | 2/1994 | Pham | | |
| 5,307,230 A * | 4/1994 | MacKenzie | | 361/96 |
| 5,334,939 A | 8/1994 | Yarbrough | | |
| 5,353,014 A | 10/1994 | Carroll et al. | | 340/638 |
| 5,359,293 A | 10/1994 | Boksiner et al. | | 324/544 |
| 5,363,269 A | 11/1994 | McDonald | | |
| 5,373,241 A | 12/1994 | Ham, Jr. et al. | | 324/536 |
| 5,383,084 A | 1/1995 | Gershen et al. | | 361/113 |
| 5,388,021 A | 2/1995 | Stahl | | 361/56 |
| 5,396,179 A | 3/1995 | Domenichini et al. | | 324/546 |
| 5,412,526 A | 5/1995 | Kapp et al. | | 361/56 |
| 5,414,590 A | 5/1995 | Tajali | | 361/669 |
| 5,420,740 A | 5/1995 | MacKenzie et al. | | 361/45 |
| 5,424,894 A | 6/1995 | Briscall et al. | | 361/45 |
| 5,432,455 A | 7/1995 | Blades | | 324/536 |
| 5,434,509 A | 7/1995 | Blades | | 324/536 |
| 5,444,424 A | 8/1995 | Wong et al. | | 335/172 |
| 5,446,431 A | 8/1995 | Leach et al. | | 335/18 |
| 5,448,443 A | 9/1995 | Muelleman | | 361/111 |
| 5,452,223 A | 9/1995 | Zuercher et al. | | 364/483 |
| 5,459,630 A | 10/1995 | MacKenzie et al. | | 361/45 |
| 5,473,494 A | 12/1995 | Kurosawa et al. | | 361/3 |
| 5,477,150 A | 12/1995 | Ham, Jr. et al. | | 324/536 |
| 5,481,235 A | 1/1996 | Heise et al. | | 335/18 |
| 5,483,211 A | 1/1996 | Carrodus et al. | | 335/18 |
| 5,485,093 A | 1/1996 | Russell et al. | | 324/522 |
| 5,493,278 A | 2/1996 | Mackenzie et al. | | 340/638 |
| 5,506,789 A | 4/1996 | Russell et al. | | 364/492 |
| 5,510,946 A | 4/1996 | Franklin | | |
| 5,512,832 A | 4/1996 | Russell et al. | | 324/522 |
| 5,519,561 A | 5/1996 | Mrenna et al. | | 361/105 |
| 5,531,617 A | 7/1996 | Marks | | 439/723 |
| 5,546,266 A | 8/1996 | Mackenzie et al. | | 361/93 |
| 5,561,605 A | 10/1996 | Zuercher et al. | | 364/483 |
| 5,568,371 A | 10/1996 | Pitel et al. | | 363/39 |
| 5,578,931 A * | 11/1996 | Russell et al. | | 324/536 |
| 5,590,010 A | 12/1996 | Ceola et al. | | 361/93 |
| 5,590,012 A | 12/1996 | Dollar | | 361/113 |
| 5,602,709 A | 2/1997 | Al-Dabbagh | | 361/85 |
| 5,608,328 A | 3/1997 | Sanderson | | 324/529 |
| 5,617,019 A | 4/1997 | Etter | | 324/117 |
| 5,638,244 A | 6/1997 | Mekanik et al. | | 361/62 |
| 5,657,244 A | 8/1997 | Seitz | | 364/492 |
| 5,659,453 A | 8/1997 | Russell et al. | | 361/93 |
| 5,682,101 A | 10/1997 | Brooks et al. | | 324/536 |
| 5,691,869 A | 11/1997 | Engel et al. | | |
| 5,701,110 A | 12/1997 | Scheel et al. | | 335/132 |
| 5,706,154 A | 1/1998 | Seymour | | 361/42 |
| 5,706,159 A | 1/1998 | Dollar, II et al. | | 361/113 |
| 5,726,577 A | 3/1998 | Engel et al. | | 324/536 |
| 5,729,145 A | 3/1998 | Blades | | 324/536 |
| 5,754,386 A | 5/1998 | Barbour et al. | | 361/154 |
| 5,764,125 A | 6/1998 | May | | 336/92 |
| 5,774,555 A | 6/1998 | Lee et al. | | 381/4 |
| 5,784,020 A | 7/1998 | Inoue | | 341/141 |
| 5,805,397 A | 9/1998 | MacKenzie | | 361/42 |
| 5,805,398 A | 9/1998 | Rae | | 361/42 |
| 5,815,352 A | 9/1998 | Mackenzie | | 361/42 |
| 5,818,237 A | 10/1998 | Zuercher et al. | | 324/536 |
| 5,818,671 A | 10/1998 | Seymour et al. | | 361/42 |

| | | | |
|---|---|---|---|
| 5,825,598 A | 10/1998 | Dickens et al. | 361/42 |
| 5,834,940 A | 11/1998 | Brooks et al. | 324/424 |
| 5,835,319 A | 11/1998 | Welles, II et al. | 361/5 |
| 5,835,321 A | 11/1998 | Elms et al. | 361/45 |
| 5,839,092 A | 11/1998 | Erger et al. | 702/58 |
| 5,847,913 A | 12/1998 | Turner et al. | 361/93 |
| 5,886,860 A | 3/1999 | Chen et al. | 361/9 |
| 5,886,861 A | 3/1999 | Parry | 361/42 |
| 5,889,643 A | 3/1999 | Elms | 361/42 |
| 5,896,262 A | 4/1999 | Rae et al. | 361/94 |
| 5,905,619 A | 5/1999 | Jha | 361/93 |
| 5,933,305 A | 8/1999 | Schmalz et al. | 361/42 |
| 5,933,308 A | 8/1999 | Garzon | 361/62 |
| 5,933,311 A | 8/1999 | Chen et al. | 361/106 |
| 5,946,179 A | 8/1999 | Fleege et al. | 361/93 |
| 5,963,406 A | 10/1999 | Neiger et al. | 361/42 |
| 5,999,384 A | 12/1999 | Chen et al. | 361/42 |
| 6,002,561 A | 12/1999 | Dougherty | 361/42 |
| 6,011,680 A | 1/2000 | Solleder et al. | 361/90 |
| 6,031,699 A | 2/2000 | Dollar, II et al. | 361/42 |
| 6,054,887 A | 4/2000 | Horie et al. | 327/307 |
| 6,088,205 A * | 7/2000 | Neiger et al. | 361/42 |
| 6,097,884 A | 8/2000 | Sugasawara | 395/500.05 |
| 6,185,732 B1 | 2/2001 | Mann et al. | 717/4 |
| 6,242,922 B1 * | 6/2001 | Daum et al. | 324/520 |
| 6,246,556 B1 | 6/2001 | Haun et al. | 361/42 |
| 6,259,996 B1 | 7/2001 | Haun et al. | 702/58 |
| 6,339,525 B1 | 1/2002 | Neiger et al. | 361/42 |
| 6,377,427 B1 | 4/2002 | Haun et al. | 361/42 |
| 6,414,829 B1 | 7/2002 | Haun et al. | 361/42 |
| 6,456,471 B1 | 9/2002 | Haun et al. | 361/42 |
| 6,477,021 B1 | 11/2002 | Haun et al. | 361/42 |
| 6,525,918 B1 * | 2/2003 | Alles et al. | 361/93.1 |
| 6,532,424 B1 | 3/2003 | Haun et al. | 702/58 |
| 6,567,250 B1 | 5/2003 | Haun et al. | 361/42 |
| 6,570,392 B1 * | 5/2003 | Macbeth et al. | 324/536 |
| 6,577,138 B1 * | 6/2003 | Zuercher et al. | 324/536 |
| 6,590,754 B1 * | 7/2003 | Macbeth | 361/42 |
| 6,621,669 B1 | 9/2003 | Haun et al. | 361/42 |
| 6,625,550 B1 | 9/2003 | Scott et al. | 702/58 |
| 7,003,435 B1 * | 2/2006 | Kolker et al. | 702/185 |
| 2001/0033469 A1 | 10/2001 | Macbeth et al. | 361/42 |

FOREIGN PATENT DOCUMENTS

| | | |
|---|---|---|
| CA | 2256243 | 6/1999 |
| DE | 105100 | 6/1924 |
| DE | 195 15 067 | 2/1997 |
| DE | 196 01 884 A1 | 7/1997 |
| DE | 196 33 527 | 2/1998 |
| EP | 0094 871 A1 | 5/1983 |
| EP | 07255110 | 3/1995 |
| EP | 0 712 193 | 5/1996 |
| EP | 0813281 A2 | 12/1997 |
| EP | 0981193 A2 | 2/2000 |
| EP | 1005129 A2 | 5/2000 |
| GB | 227930 | 1/1925 |
| GB | 865775 | 4/1961 |
| GB | 2177561 A | 6/1985 |
| GB | 2 241 396 A | 8/1991 |
| GB | 2285886 A | 7/1995 |
| JP | 58 180960 | 10/1983 |
| WO | WO 97/30501 | 8/1997 |
| WO | WO 99/43065 | 8/1999 |
| WO | WO 03/105303 A1 | 12/2003 |

OTHER PUBLICATIONS

Alejandro Duenas, J., Directional Coupler Design Graphs For Parallel Coupled Lines and Interdigitated 3 dB Couplers, RF Design, Feb. 1986, pp. 62-64.

Jean-Francois Joubert, Feasibility of Main Service Ground-Fault Protection On The Electrical Service To Dwelling Units, Consultants Electro-Protection Ins., 1980, Michelin St., Laval, Quebec H7L 9Z7. Oct. 26, 1990, pp. 1-77.

B.D. Russell, Detection Of Arcing Faults On Distribution Feeders, Texas A & M Research Foundation, Box H. College Station, Texas 77843, Final Report Dec. 1982, pp. 1-B18.

Supplementary European Search Report dated Jan. 14, 2005 for application No. EP 99 93 5468.

Supplementary European Search Report dated Feb. 25, 2005 for application No. EP 99 90 5523.

International Search Report dated Oct. 29, 2004 for application No. PCT/US2004/014829.

* cited by examiner

ARC DETECTION USING LOAD RECOGNITION, HARMONIC CONTENT AND BROADBAND NOISE

CROSS-REFERENCE TO RELATED APPLICATION

This is a continuation-in-part of pending U.S. patent application Ser. No. 09/981,603, filed Oct. 17, 2001 entitled "Arc Fault Circuit Interrupter System".

FIELD OF THE INVENTION

The present invention relates to the protection of electrical circuits and, more particularly, to the detection of electrical faults of the type known as arcing faults in an electrical circuit.

BACKGROUND OF THE INVENTION

The electrical systems in residential, commercial and industrial applications usually include a panelboard for receiving electrical power from a utility source. The power is then routed through protection devices to designated branch circuits supplying one or more loads. These overcurrent devices are typically circuit interrupters such as circuit breakers and fuses which are designed to interrupt the electrical current if the limits of the conductors supplying the loads are surpassed.

Circuit breakers are a preferred type of circuit interrupter because a resetting mechanism allows their reuse. Typically, circuit breakers interrupt an electric circuit due to a disconnect or trip condition such as a current overload or ground fault. The current overload condition results when a current exceeds the continuous rating of the breaker for a time interval determined by the trip current. A ground fault trip condition is created by an imbalance of currents flowing between a line conductor and a neutral conductor which could be caused by a leakage current or an arcing fault to ground.

Arcing faults are commonly defined as current through ionized gas between two ends of a broken conductor or at a faulty contact or connector ("series" arcs), or, between two conductors supplying a load, or between a conductor and ground ("parallel" arcs). However, arcing faults may not cause a conventional circuit breaker to trip. Arcing fault current levels may be reduced by branch or load impedance to a level below the trip curve settings of the circuit breaker. In addition, an arcing fault which does not contact a grounded conductor or person will not trip a ground fault protector.

There are many conditions that may cause an arcing fault. For example, corroded, worn or aged wiring, connectors, contacts or insulation, loose connections, wiring damaged by nails or staples through the insulation, and electrical stress caused by repeated overloading, lightning strikes, etc. These faults may damage the conductor insulation and/or cause the conductor to reach an unacceptable temperature.

The present invention concerns detection of low current series arcs that occur within the normal operating range of household appliances and/or low current series arc fault detection that is within the handle rating of the protection device (e.g., a household circuit breaker).

U.S. Pat. No. 6,008,973 (commonly assigned) based largely on slope changes in the load current and does not look at specific sub harmonic, broadband noise content and/or utilize load recognition. In contrast, this invention uses sub harmonic content, broadband noise and load recognition to set thresholds and select arc signatures.

More specifically, load recognition and periodic or repetitive sub-harmonic and high frequency content are used in the determination of "series arc" or "no arc" conditions in the protected circuit/load.

The invention may be applied to residential, commercial, industrial applications for circuit protection against series arc faults.

OBJECTS AND SUMMARY OF THE INVENTION

It is an object of the present invention to provide an arc fault detection system and method which reliably detects arc fault conditions which may be ignored by conventional circuit interrupters.

Another object of the invention is to provide an arc fault detection system which utilizes a minimum number of highly reliable electronic signal processing components, such as a microcontroller, to perform most of the signal processing and analyzing functions, so as to be relatively simple and yet highly reliable in operation.

Other and further objects and advantages of the invention will be apparent to those skilled in the art from the present specification taken with the accompanying drawings and appended claims.

In accordance with one aspect of the invention, there is provided a method of determining whether arcing is present in an electrical circuit comprises sensing a change in current in the circuit and developing a corresponding input signal, analyzing the input signal to determine the presence of broadband noise in a predetermined range of frequencies, and producing a corresponding output signal, and processing the input signal and the output signal in a predetermined fashion to determine whether an arcing fault is present in the circuit, the processing including determining a type of load connected to the electrical circuit, based upon the input signal and the output signal.

In accordance with another aspect of the invention, there is provided a system for determining whether arcing is present in an electrical circuit comprises a sensor for sensing current in the circuit and developing a corresponding sensor signal, a circuit for analyzing the sensor signal to determine the presence of broadband noise in a predetermined range of frequencies, and producing a corresponding output signal, and a controller for processing the sensor signal and the output signal to determine load current characteristics and to determine, using the load current characteristics and the presence of broadband noise, a type of load connected to the electrical circuit and whether an arcing fault is present in the circuit.

In accordance with another aspect of the invention, there is provided a controller for a system for determining whether arcing is present in an electrical circuit in response to input signals, the input signals corresponding to a changing current in the circuit and to the presence of broadband noise in a predetermined range of frequencies in the circuit, the controller comprises a plurality of counters, means for incrementing one or more of the plurality of counters in accordance with the input signals and means for periodically determining a type of load connected to the electrical circuit and whether an arcing fault is present using at least the states of one or more of the plurality counters.

In accordance with another aspect of the invention, there is provided a method of determining whether arcing is present in an electrical circuit in response to input signals, the input signals corresponding to a changing current in the circuit and to the presence of broadband noise in a predetermined range of frequencies in the circuit, the method comprises incrementing one or more of a plurality of counters in accordance with the input signals, and periodically determining a type of load connected to the electrical circuit and whether an arcing fault is present using the states of one or more of the plurality of counters.

DETAILED DESCRIPTION OF THE ILLUSTRATED EMBODIMENT

Figure 1A:
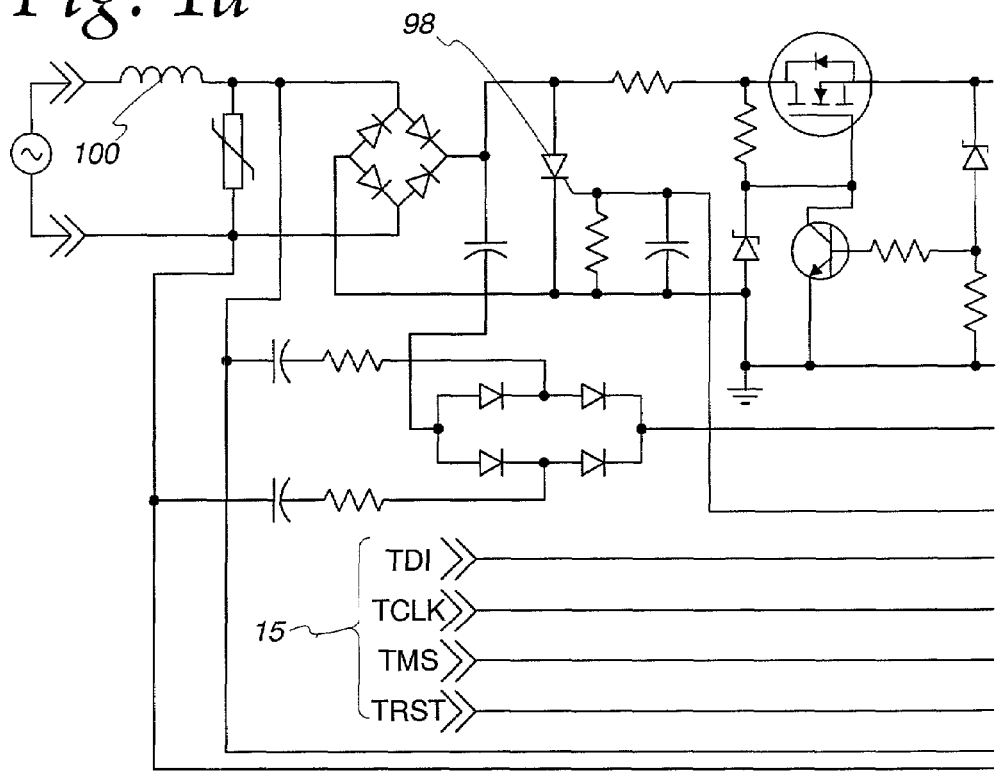
FIG. 1a and 1b form a circuit schematic of an arc fault circuit interrupter system in accordance with the invention.
Figure 1A:
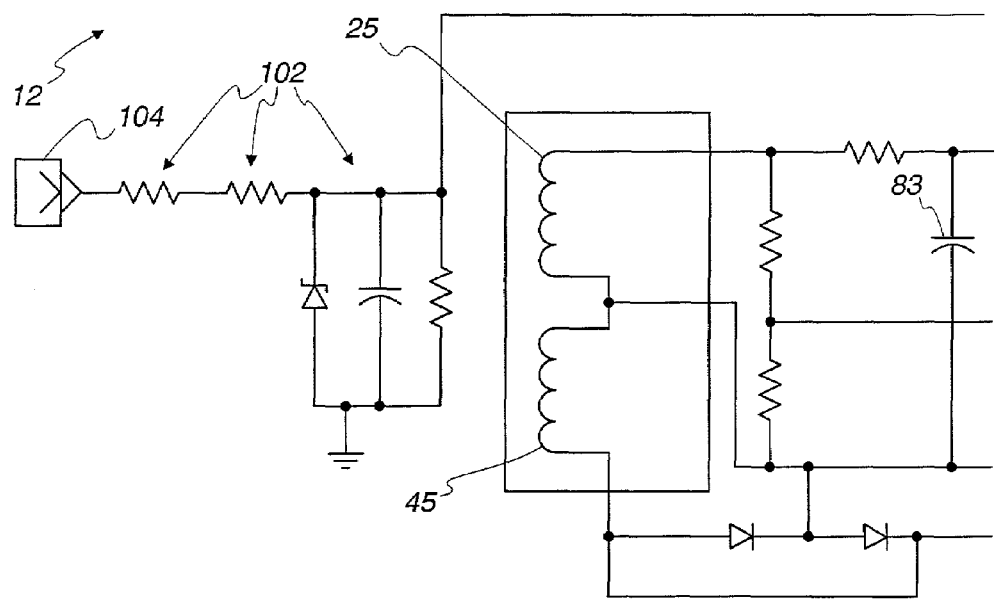
Figure 1B:
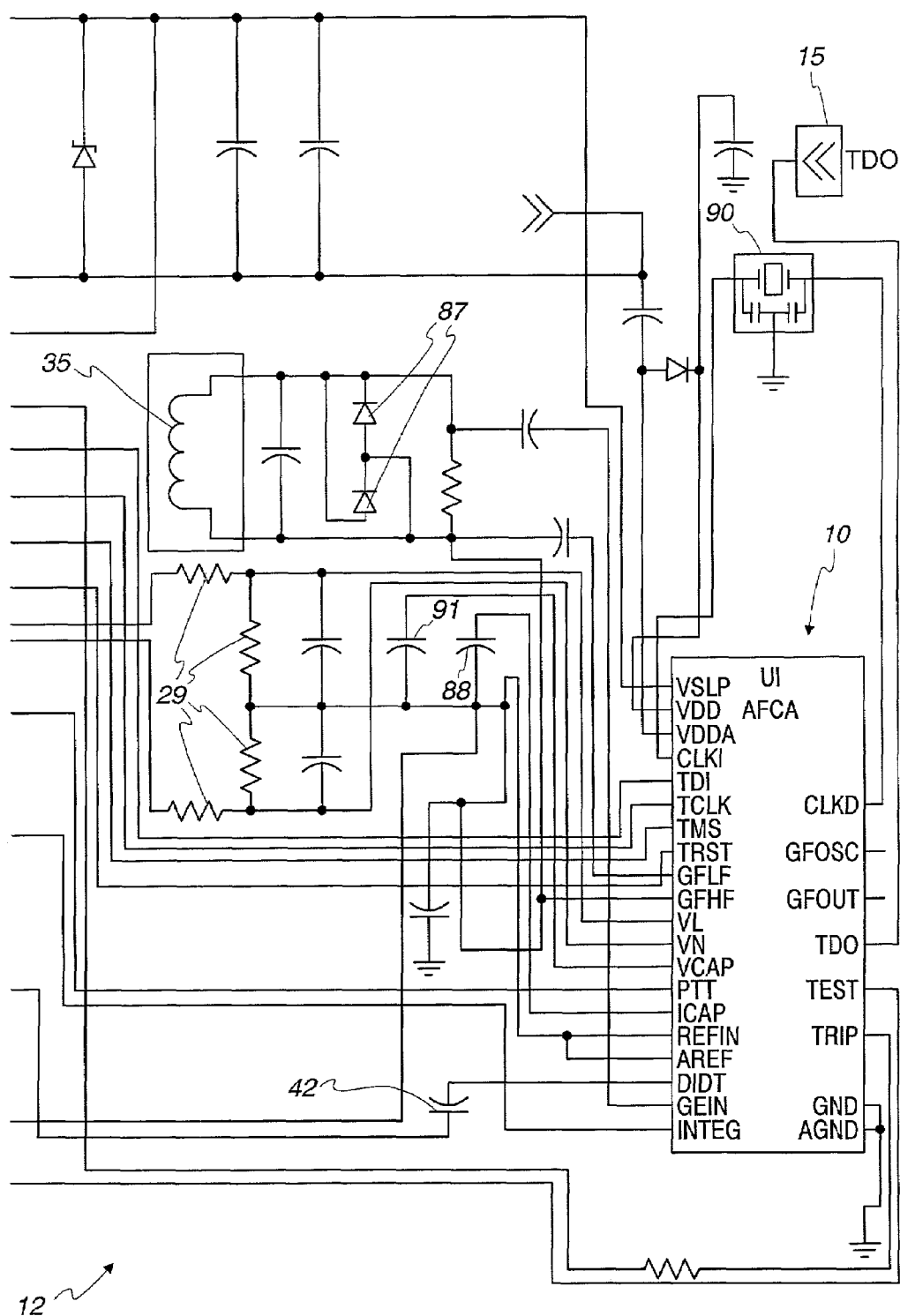

This invention pertains to the use of a system on chip solution for arc fault detection primarily for use in circuit breakers or electrical outlet receptacles, or other electrical devices, typically but not limited to the 15 or 20 ampere size. Referring to FIGS. 1a and 1b, this microchip 10, when incorporated on an electronic printed wiring board 12 with a minimum of external components, provides arc fault detection and tripping of the host wiring device.

Figure 2:
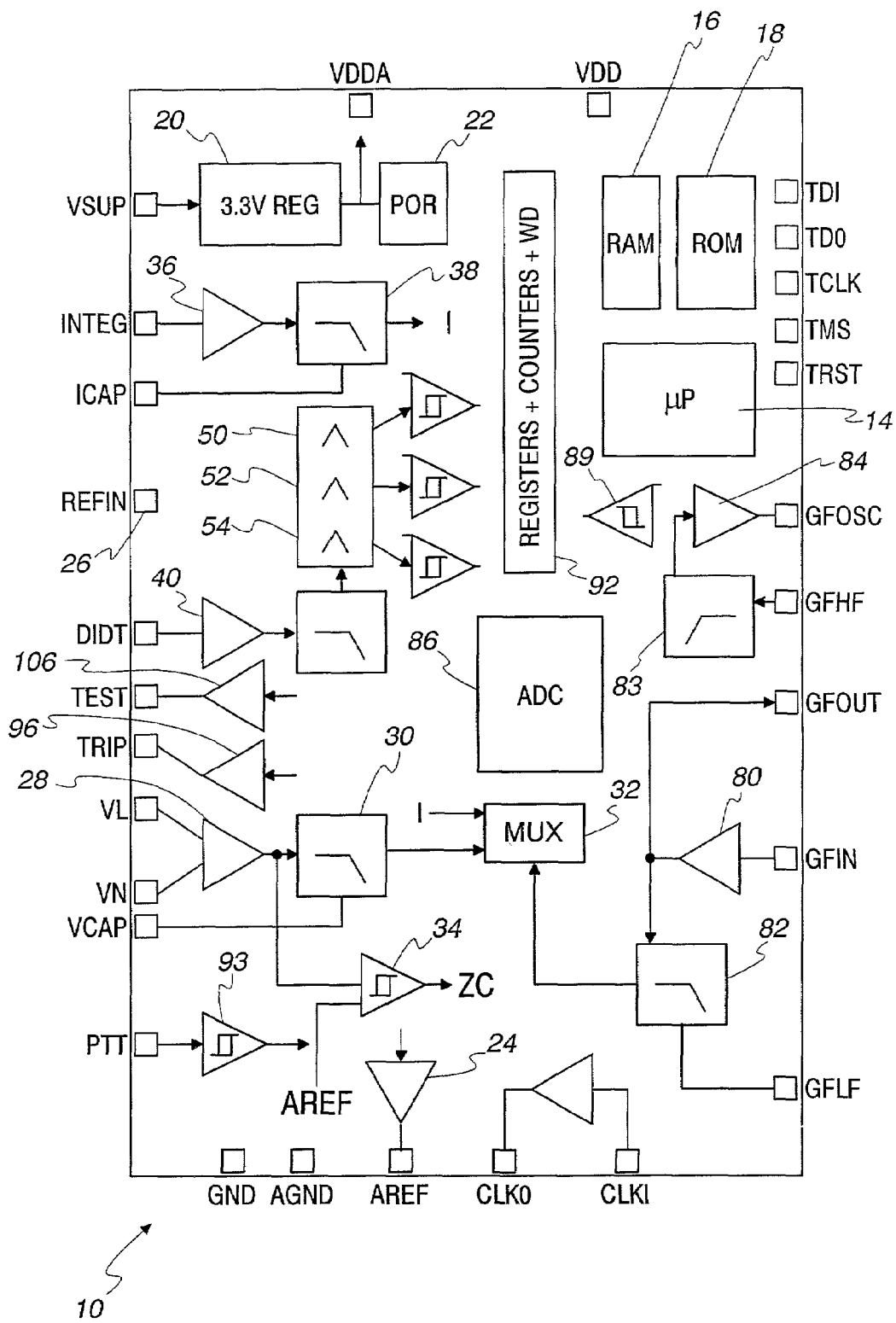
FIG. 2 is a functional diagram showing further details of an application specific integrated circuit chip which forms a part of a system of FIG. 1.

The system on chip is an application specific integrated circuit which combines analog and digital signal processing on a single microchip. A block diagram is shown in FIG. 2.

The "system on chip" 10 monitors line voltage and current in the host device and analyzes them for the presence of an arc fault. If certain arc detection criteria are met as determined by an arcing algorithm embedded within the software of a microcontroller's 14 memory 18, the chip signals an external SCR98 causing it to disconnect the device from the load.

The ASIC generally includes a processor or microcontroller 14, memories, amplifier stages, filters, A/D converter, analog multiplexer, a voltage regulator and power on reset circuit. The tasks of the ASIC are: measure line voltage, detect voltage zero crossings, measure 60 Hz line current, measure ground fault current, detect ground loops (grounded neutral) in neutral line, detect high frequency components of line current, provide voltage regulation for all ASIC circuits, detect presence of a signal to commence self test, generate a self test high frequency current source, provide under voltage reset (POR) for the microcontroller, provide a trip signal to fire a trip solenoid driver, provide a watchdog to reset the microcontroller, and make a trip decision based on embedded code in the microcontroller.

The ASIC can operate in two different modes:

The "normal" mode corresponds to the mode where the processor 14 is the master. In normal mode, the microprocessor controls the data conversion rate (A-to-D), counters, interruptions and data memories. The microprocessor executes code stored in a ROM memory. Moreover, the microprocessor controls the activity of all analog blocks by forcing "power down" signal in order to limit the power dissipation. This mode is the normal operation mode of the ASIC.

The "slave" mode corresponds to the mode where the processor 14 is the slave and is controlled by a standard communication channel (e.g., a JTAG) interface or port 15 (see FIGS. 1a and 1b). Two main operations can be done in this mode using the JTAG interface 15: debug mode, and register values and data transfer. The JTAG port can be used to couple a personal computer (PC) or other external processor to the ASIC, using the processor 14 of the ASIC as a slave processor. This permits interrogation of the ASIC counters, registers, etc. as well as rewriting to memories, registers, etc. of the ASIC. The JTAG ports 15 include data in/out ports (TDI, TDO), and reset (TRST), clock (TCLK) and mode select (TMS) ports.

The processor 14, in one embodiment, is the ARM7TDMI from ARM company. The ARM has a boundary scan circuit around its interface which is used for production test or for connection to an in-circuit emulator (ICE) interface (i.e., the JTAG) for system and software debugging. The JTAG interface is accessible via the pins TDI, TDO, TMS, TCK and TRST and behaves as specified in the JTAG specification.

The processor is 32 bit wide and has a CPU frequency of 12 MHz. An external resonator 90 (FIG. 1b) has a frequency of 24 MHz which is divided by two for the CPU. The microprocessor analyzes the current, ground fault and di/dt signals and by means of an arc detection algorithm makes a trip decision, using the presence of broadband noise and the current signature and rise time (di/dt). One such algorithm is described in U.S. Pat. No. 6,259,996, issued Jul. 10, 2001 to which reference is invited. While the line voltage is fed to the microprocessor, it may be optionally used by the algorithm to effect various levels of arc detection as dictated by the embedded software. The microprocessor uses the zero crossing signal to synchronize the arc detection algorithm with line voltage.

There are different clock domains in the ASIC: A clock for the ARM, the bus controller and the memories. The microprocessor clock frequency is 12 MHz. Clocks for the peripherals (counters, watchdog, ADC, BP filters) are 4 MHz, 1 MHz and 250 KHz frequencies. These clocks are fixed and derived from the ARM clocks.

There are two memory domains. The program memory, which contains the software for the ARM operation, the program memory space contains a 10 kb ROM (2560 words of 32 bits), and the program memory start address is 0000:0000hex. The data memory 16 contains the program data and consists of two RAMs of 128 bytes×16 bits for a total of 512 bytes. The memory access can be 32 bits or 16 bits wide. The ARM selects the access mode. The data memory start address is 0004:0000hex. In addition to the memories, the processor can also access registers. The register memory start address is 0008:0000hex.

The various functional blocks (see FIG. 2) and their respective operation is described briefly below:

A 3.3V regulator 20 provides a finely regulated DC power source for use by the analog and digital sections of the chip. The input to the chip need only be roughly regulated to within coarse limits, for example 4 to 7 volts.

The POR or power on reset circuit 22 senses the chip's regulated voltage supply and holds the microcontroller in a reset state if the voltage is below a safe operating limit.

The analog reference circuit (AREF) 24 provides a reference point for the input signals at the midpoint of the analog power supply to allow the amplified signals to swing both positive and negative. The AREF is externally connected to the REFIN pin 26.

A Vl/Vn differential amplifier 28 differentially measures line voltage at the terminals of the host device via an externally located voltage divider 29 (FIG. 1b). The voltage signal is low pass filtered as shown at the low pass filter block 30 to remove high frequency noise or harmonics and to provide anti-aliasing. The filtered signal is sent to a first channel of a multiplexer 32 and also to the input of a zero crossing detector 34. The output voltage at VCAP pin and an external capacitor 91 (FIG. 1b) provides an anti-aliasing low-pass filter (LPF) for the A/D converter 86. The typical differential input range at the inputs is +/−0.65V.

A comparator 34 at the output of the line voltage differential amplifier 28 detects zero crossings (ZC) in the line voltage for use in synchronizing an arc detection algorithm.

An amplifier 36 at the INTEG input amplifies the externally integrated output of a di/dt sensor before it is lowpass filtered 38 for anti-aliasing and sent to a second channel of the multiplexer 32 previously referenced.

The output of a di/dt sensor 25 (see FIG. 1) monitoring line current through the host device is connected to the input of a di/dt amplifier 40 after first being high pass filtered by filter capacitors 42 (FIG. 1b) to remove the 60 Hz component. The di/dt signal is amplified at amplifier 40 and sent to the input of three bandpass filters 50, 52, 54. Broadband noise in the 10 KHz to 100 KHz range appearing at the DIDT input is one indicator of the presence of arcing.

Figure 3:
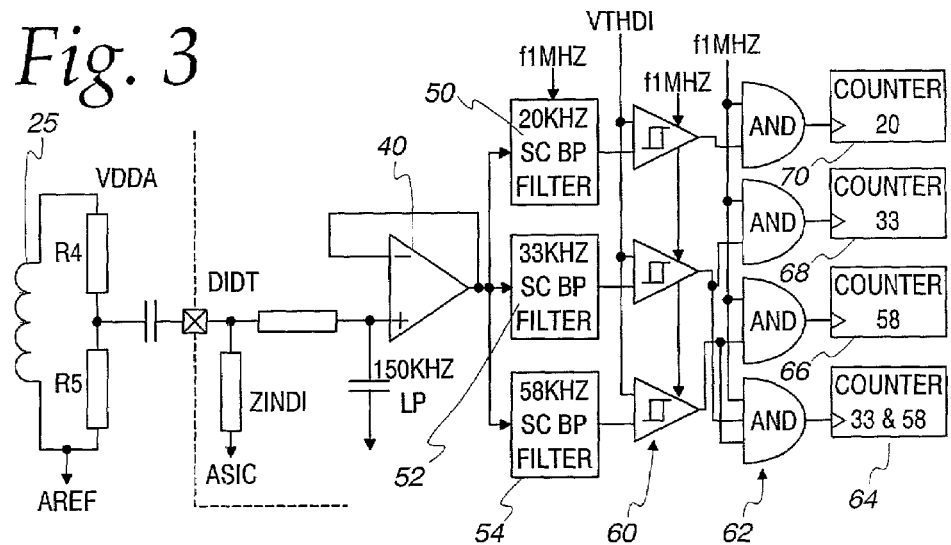
FIG. 3 is a functional block diagram illustrating operation of a digital circuit portion of the chip of FIG. 2.

FIG. 3 shows a more detailed block diagram of the di/dt sensing system. Three switched cap (SC) bandpass filters (BPF) 50, 52, 54 set respectively at 20, 33 and 58 KHz, filter the di/dt signal to determine if there is broadband noise in the line current. The 20 KHz filter 50 is provided for added flexibility in future arc detection devices. The output of the filters is monitored by a set of comparators 60 whose outputs change state when a predetermined threshold is exceeded. The microprocessor 14 (FIG. 2) monitors the state of each filter's comparator individually and also the logically ANDed output at AND gates 62 of the 33 and 58 KHz filters to determine the presence of broadband noise. The comparator 60 outputs and the AND gates 62 are synchronized by the same clock (f=1 MHz) as the switched capacitor bandpass filters 50, 52 54. It should be noted that the ANDing of the comparator outputs with the clock insures that the components of high frequency in the passbands of both the 33 KHz and 58 KHz filters must be simultaneously present and of sufficient amplitude in order to be considered broadband noise and therefore be counted by the 33/58 counter. Separate counters are provided for future use, for counting the components in the passbands of the 20 KHz, 33 KHz and 58 KHz BPF's, respectively.

The ASIC provides an amplification of the di/dt input signal and performs analog signal processing. As described above, the signal going through three independent switched-cap bandpass filters (BP) (20, 33 and 58 KHz) is compared to a fixed threshold reference voltage in both directions (positive and negative). The 20 KHz BP has a typical quality factor Q of 4. Both 33 and 58 KHz BP have typical Q of 8. The outputs of the comparators control separate counters. The ANDed boolean combination of 33 and 58 KHz BP comparator outputs controls a $4^{th}$ counter as shown in FIG. 3. All comparator outputs are synchronized on the switched-cap clock (1 MHz) and are stable during each period of 1 µs. The counters can be reset or disable by software. An anti-aliasing filter is placed in the first stage. The cut-off frequency is typically 150 KHz. The sampling clock frequency of bandpass filters is $F_{1MHz}$. Clamping anti-parallel diodes are placed between AREF and DIDT pins internal to the ASIC.

The Z-domain function of the switched-cap bandpass filters can be described by the following expression:

$Y_i=a(X_i-X_{i-1})-bY_{i-1}-cY_{i-2}$

Where $X_i$ and $Y_i$ are, respectively, the $i^{th}$ samples of input and output voltages and a, b and c are the filter coefficients.

| Coefficient of normalized BP | 20 KHz | 33 KHz | 58 KHz |
|---|---|---|---|
| a | 0.031 | 0.026 | 0.047 |
| b | −1.953 | −1.932 | −1.825 |
| c | 0.969 | 0.974 | 0.952 |

The output of a ground fault sensing transformer 35 (FIG. 1b) is connected to the input of a GFIN amplifier 80 (FIG. 2), which has a high gain to amplify the small output from the sensor. The ground fault signal is amplified and lowpass filtered (82) (FIG. 2) for anti-aliasing before being fed to the third channel of the multiplexer 32 (FIG. 2).

Figure 4:
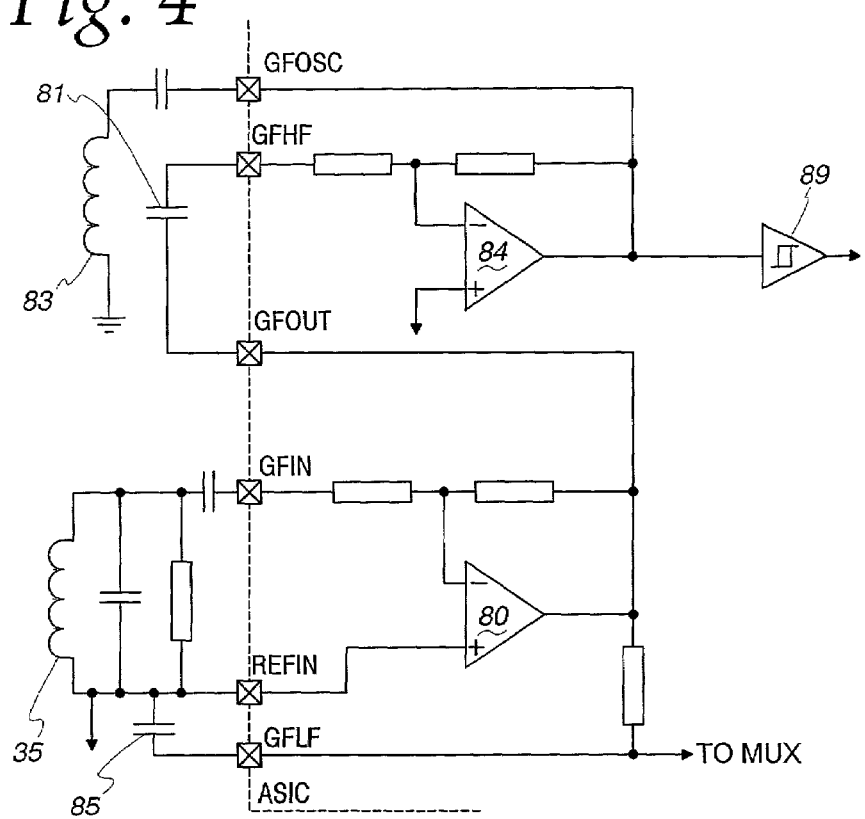
FIG. 4 is a circuit schematic of a signal processing circuit which forms a part of the chip of FIG. 1b.

Referring also to FIG. 4, this circuit performs an amplification and anti-aliasing low pass (LP) filtering of the ground fault (GF) input voltage before A-toD conversion and provides high pass (HP) filtering and amplification for the grounded neutral detection at pin GFOSC. The first gain stage 80 is a current-to-voltage converter providing signal for both low and high pass filters 82, 83 (FIG. 2). The 3 dB bandwidth of the high pass filter will be typical 15 KHz. The LP and HP filters are made by internal resistors and external capacitors 81 and 85 respectively. Clamping anti-parallel diodes 87 (see FIG. 1b) are placed between AREF and GFIN pins for transient protection.

The chip 10 has provision for personnel level ground fault protection when provided with a grounded neutral sensing transformer 83 (FIG. 4) as well as the 5 mA ground fault transformer 35 (FIG. 4). To make this feature functional, the output GFOUT may be coupled by means of a capacitor 81 to the input of GFHF. GFOSC is then capacitively coupled to the winding of the neutral sensing transformer 83. When thus connected, this forms a dormant oscillator neutral detection system, including second opamp 84 and comparator 89. The function of the second amplifier 84 at GFHF is to provide the total loop gain necessary to put the dormant oscillator into oscillation when a sufficiently low resistance grounded neutral condition exists.

The multiplexer 32 (FIG. 2) alternately selects between the three channel inputs, i.e., current, line voltage or ground fault and passes the selected signal to the input of an analog to digital (A/D) converter (ADC) 86 (FIG. 2). The analog to digital converter 86 is a single channel sigma delta converter which alternately digitizes the current, line voltage and ground fault signals for analysis by the microprocessor.

The line current signal at ASIC pin INTEG is obtained by an external low-pass filter 83 placed in the output of the di/dt coil 25 (FIG. 1*a*). The ASIC amplifies the INTEG signal. An anti-aliasing LP filter is obtained by an external capacitor 88 (FIG. 1*b*) placed at ICAP pin before A-to-D conversion stage.

The watchdog (WD) 92 monitors the operation of the ARM microprocessor 14. If the software does not reset the watchdog counter at periodic times, the watchdog generates a hard reset of the microprocessor. Alternately, it could be used to cause a trip condition. The watchdog is based on a 15 bit wide periodic counter which is driven by the 250 KHz clock. The counter is reset by software with the WDG_RST address. Writing a 1 on this address resets the counter. As noted, the watchdog must be reset only in a specific time window, otherwise a hard reset is generated. If the watchdog is reset before the counter reaches 2^14 or if the counter is not reset before the counter reaches 2^15, the watchdog reset is generated for the ARM and for the WID counter.

To allow the ARM to check the watchdog value, the MSB (bit 14) can be read and if the value is 1, the processor must reset the counter.

When the watchdog generates a reset, a specific register is set to indicate that a watchdog reset has occurred. This register value can be read even after the reset.

When a trip decision is reached, a trip signal buffer 96 latches and drives the gate of an SCR 98 of an external firing circuit (FIG. 1*a*). In order to conserve stored energy during the trip sequence, the microprocessor is halted and portions of the analog circuitry are disabled. The SCR 98 is connected in series with a trip coil 100. In the ON state, the SCR 98 causes the coil 100 to be momentarily shorted across the line to mechanically de-latch the contacts of the host device and to subsequently interrupt flow of current.

The push to test (PTT) circuit 102 monitors the status of a push to test (PTT) button 104. When the push to test button is depressed, line voltage is applied through an external voltage divider in circuit 102 to the PTT input of the chip 10. The circuit senses that a system test is being requested and signals the microprocessor to enter a test mode. The activation of the test button 104 (not part of the ASIC) is detected by the PTT comparator 93 (FIG. 2) as a voltage at a PTT (Push-to-Test) pin.

With the microprocessor in the test mode, test signal buffer 106 acts as a current source driving a test winding 45 (FIG. 1*a*) of the di/dt sensor with a sharply rising and falling edge square wave at each of the center frequencies of the bandpass filters, namely 20 KHz (when used), 33 KHz and 58 KHz in turn.

TABLE 1 below briefly describes each pin of the ASIC 10.

| Name | Type | Description |
| --- | --- | --- |
| VSUP | Power | High positive ASIC supply voltage |
| VDDA | Power | Analog positive ASIC supply voltage and regulator output |
| VDD | Power | Digital positive ASIC supply voltage (input) |
| AGND | Power | Analog ground |
| GND | Power | Digital ground |
| INTEG | Analog | Input for Current measurement |

TABLE 1-continued below briefly describes each pin of the ASIC 10.

| Name | Type | Description |
| --- | --- | --- |
| ICAP | Analog | Input for LP filter |
| REFIN | Analog | Input sense of reference voltage |
| AREF | Analog | Analog reference output |
| DIDT | Analog | Input for DIDT measurement |
| TEST | Analog | Test output signal |
| TRIP | Analog | Trip output signal |
| VL | Analog | Input for voltage measurement |
| VN | Analog | Input for voltage measurement |
| VCAP | Analog | Input for LP filter |
| PTT | Analog | PTT Input signal |
| CLKI | Analog | Input clock of quartz |
| CLKO | Analog | Output clock of quartz |
| GFIN | Analog | Input signal for GF measurement |
| GFOUT | Analog | Output of gain stage |
| GFLF | Analog | Input for LP filter |
| GFHF | Analog | Input for HP filter |
| GFOSC | Analog | Output of GF dormant gain stage |
| TDI | Digital - in | Data in |
| TDO | Digital - out | Data out |
| TCLK | Digital - in | Clock in |
| TMS | Digital - in | Select in |
| TRST | Digital - in | Reset in (active low) |

Additional Operational Description

The ground fault detection feature's primary purpose is to detect arcing to ground, in the incipient stages of arcing, where a grounding conductor is in the proximity of the faulty line conductor. Such detection and tripping can clear arc faults before they develop into major events. As discussed earlier, by the use of appropriate ground fault and neutral sensing transformers, this feature can be used to provide personnel protection as well as arc to ground detection.

When the push to test button 104 is depressed, line voltage is applied to push to test circuit 102 in such a way as to cause ground fault current to flow through the ground fault sensing transformer 83 and simultaneously force the microcontroller 14 into the test mode as described previously. The microprocessor monitors the output of both the ground fault detection circuitry and the output of the band-pass filters (caused by the test buffer driving the test winding) to determine if the bandpass filter detection circuitry is functional. Only if counters 66 and 68 have sufficiently high counts and sufficiently high ground fault signal peaks are present, will a trip signal be given.

A calibration routine allows the microprocessor 14 to compensate for the offset voltages generated by each of the operational amplifiers in the line voltage, current and ground fault measurement circuits. Immediately following power up and at periodic intervals (to update the data, e.g., to compensate for thermal drift), the microprocessor initiates a calibration procedure. During this time period, the line voltage and current measurement circuits are internally disconnected from their respective input terminals and each of the operational amplifiers is connected in turn to analog reference voltage (AREF) 24. The respective offset voltages (one for each op amp) are then read by the microprocessor and their values are stored in memory. The stored offset voltages are subtracted from the measured signal values by the software. The ground fault offset is measured by internally shorting the first stage amplifier (80) gain setting resistors and reading the offset voltage on an external AC coupling capacitor directly from the input. The software subtracts this value from the measured signal value.

Residential type circuit breakers incorporating arc fault circuit protection require a very small printed wiring board with low power dissipation. Arc fault circuit interruption requires significant analog and digital signal processing in order to reliably distinguish between arc faults and electrically noisy loads, such as arcs from light switches and universal motors. In a previous embodiment, such processing was achieved using a separate analog ASIC (application specific integrated circuit) and a microcontroller.

The system on chip design provides a reduced package size, approximately ⅓ reduction, as well as a reduction in external components required. The combination of reduced parts and part placement results in a significant cost reduction and ease of assembly. Bandpass filter performance is more consistent, offset voltage correction is improved, test circuit performance is improved, and ground fault personnel protection can be provided.

Using load current, rate of rise of the load current (di/dt) and system line voltage, the invention detects series arcing conditions in household appliance cords and electrical wiring. Using load current, rate of rise of the load current (di/dt) and system line voltage inputs the method presented below will recognize the load if one is present, use the appropriate arc detection algorithms that match the load and determine if there are arcing signatures. When arcing signatures are detected, a trip signal is initiated and opens the circuit breaker, disabling the arcing source.

The described embodiment of the invention is for 15A or 20A household branch circuit breakers but the invention is not so limited.

We have found that series arc signatures are different with different types of loads in series with the arc. We have found that the best way to detect series arcing is to first categorize the signature of the load current and then look for arcing signatures for that type of load. We have found that most residential loads can be categorized, by their wave shape and phase relationship, into eight categories. We have designated these categories: "compressors," "computers," "computers and resistive," "brush motor," "light dimmer," "light dimmer and resistive," "variable speed motors" and "resistive." Even though these load type designations were used, others may be included to add additional series arc performance, without departing from the invention.

Figure 5A:
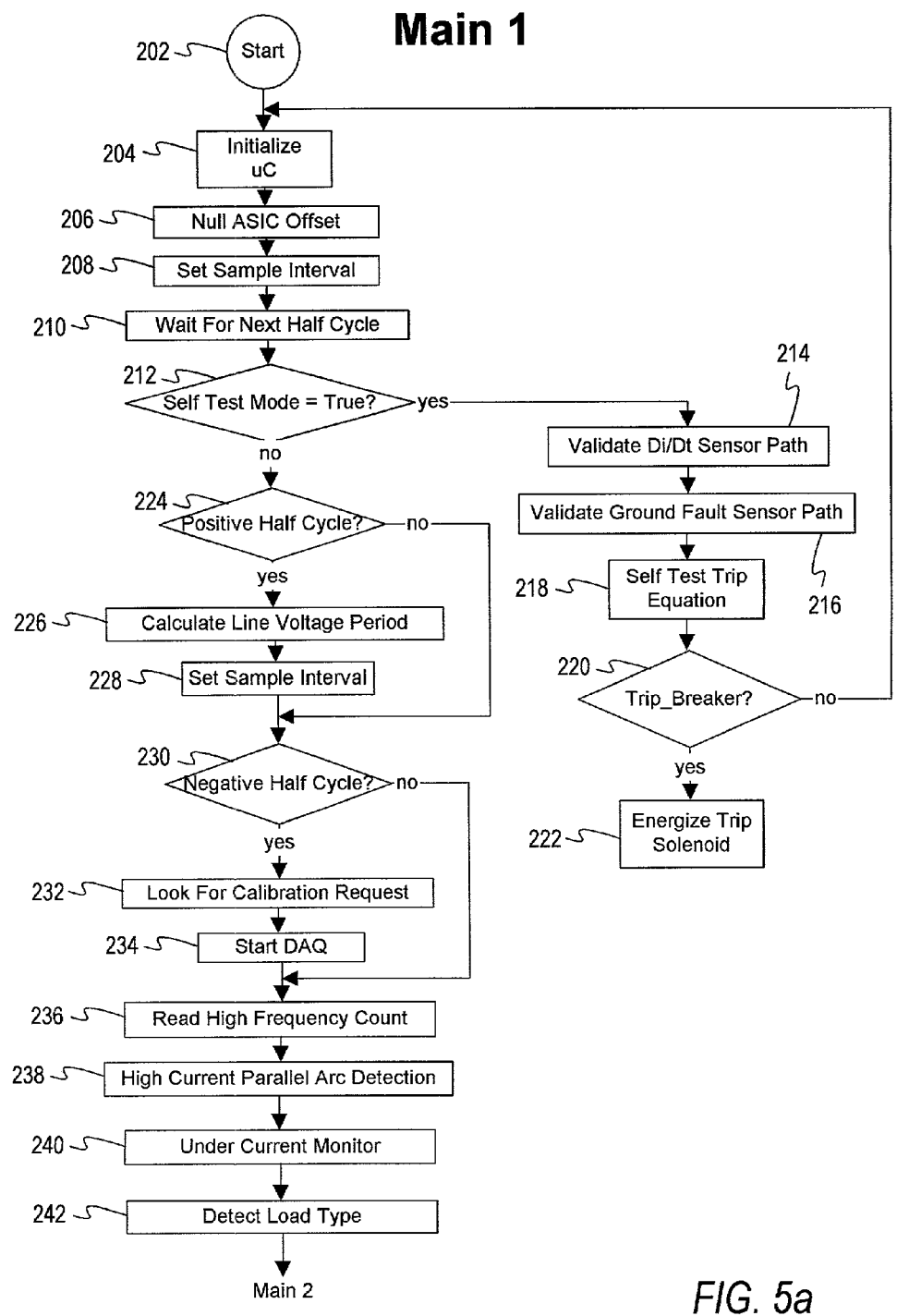
FIGS. 5a and 5b are flowcharts showing operation of a main program sequence in accordance with the invention.
Figure 5B:
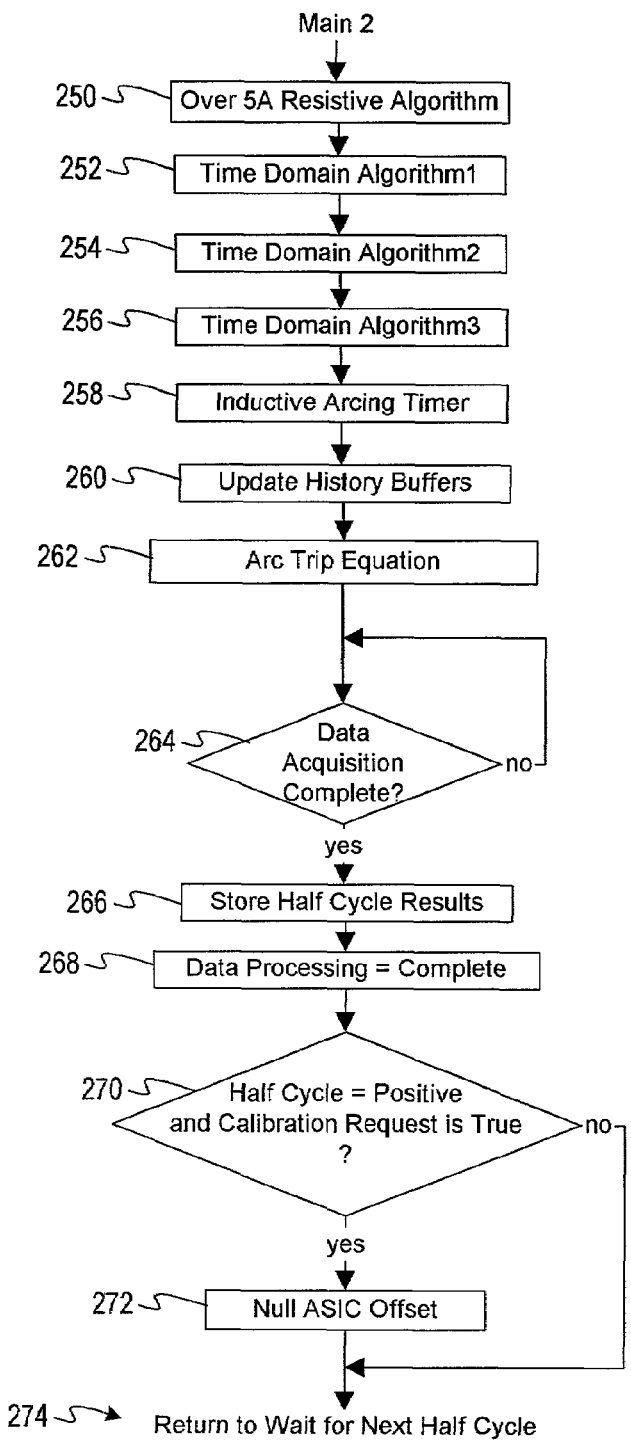

Referring now to FIGS. 5a and 5b, a main program sequence at a start 202 initializes 204 a microprocessor or controller, nulls ASIC offsets 206 of the ASIC, select or sets sample intervals 208 and then it waits 210 for the next half cycle of monitored current. A self test mode 212 is then entered if called for, which validates a di/dt sensor path (214) and a ground fault sensor path (216) and then enters a self test trip equation routine 218 (see FIG. 6) which, if successful, trips a breaker (220) to energize a trip solenoid, (222) and otherwise returns to the initialization 204. If the self test mode 212 is not to be carried out, the next positive half cycle is found at 224, whereupon line voltage potential is calculated and a sample interval is set 228.

If a negative half cycle is encountered 230, the program looks for a calibration request 232 and starts data acquisition (DAQ) 234. If, however, a positive half cycle is first encountered, a high frequency count is read 236 and a high current parallel arc detection 238 takes place. The parallel arc detection may be in accordance with our prior U.S. Pat. No. 6,259,996. At this time, an undercurrent monitor routine 240 and detect load type routine 242 are run (see FIGS. 7 and 8a–8g).

Referring to FIG. 5b, a number of additional routines or algorithms are then run including an over 5 amp resistive algorithm 250 and three time domain algorithms 252, 254 and 256. These are followed by an inductive arcing timer routine 258 (see also FIG. 13). At this point, if data acquisition is complete 264, the half cycle results are sorted 266 and data processing is completed 268. If the half cycle is positive and the calibration request is true (270), the ASIC offset is nulled 272 and the program returns to 210 to wait for the next half cycle. If the half cycle is not positive and/or calibration request is not true, the program returns to 210 to wait for the next half cycle.

Figure 6:
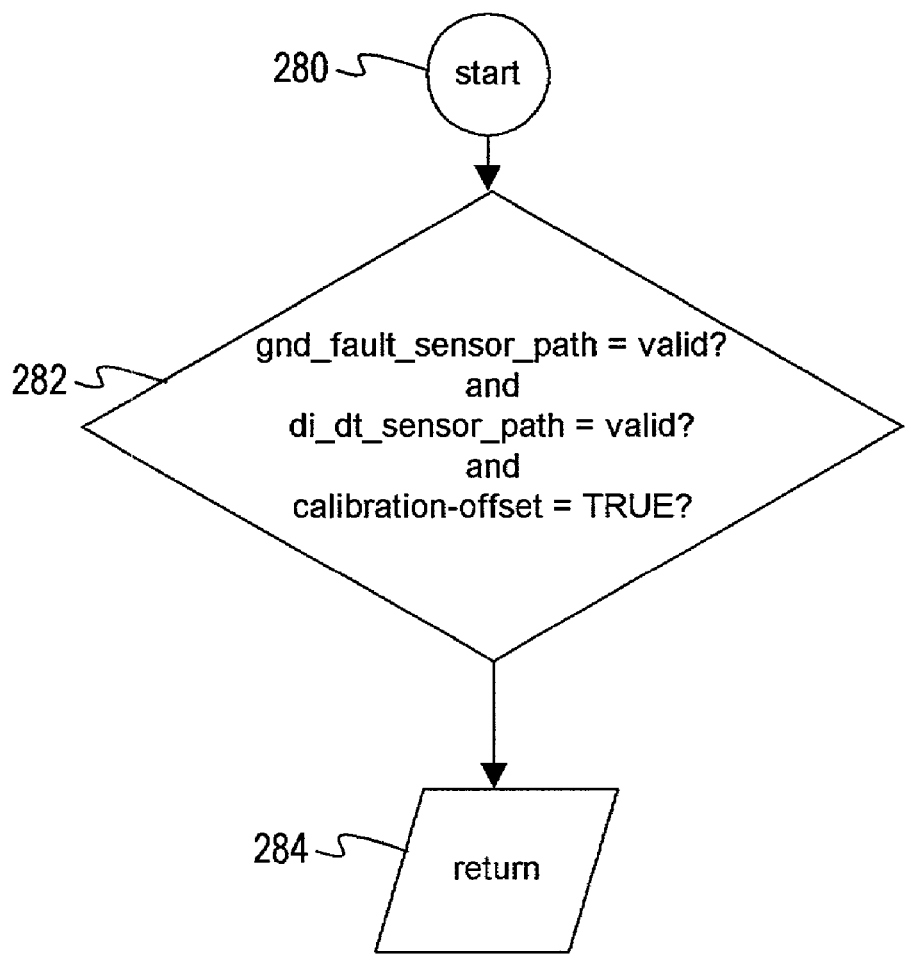
FIG. 6 is a flowchart showing operation of a self test trip equation program.

FIG. 6 shows the above-referenced self test trip equation subroutine 218 which includes a start 280, a checking for validity of ground fault and di/dt sensor paths and calibration offset 282 and a return 284.

Figure 7:
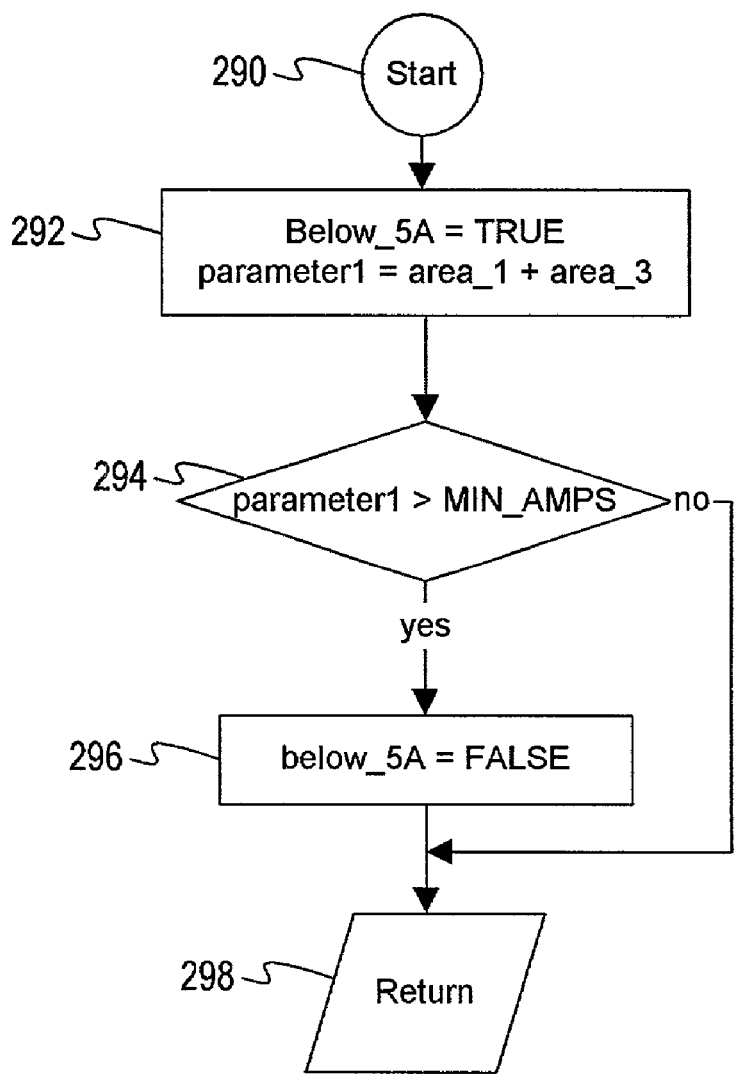
FIG. 7 is a flowchart showing operation of an undercurrent monitor program.

Referring to FIG. 7, the undercurrent monitor routine 240 starts at 290 and sets a below 5 amp register true and a parameter 1 register to a sum of area 1 and area 3 (explained later) at 292. If parameter is then greater than a minimum amps figure, a below 5 amp register is set to false at 294 and 296. Otherwise, the routine enters a return 298.

Figure 8A:
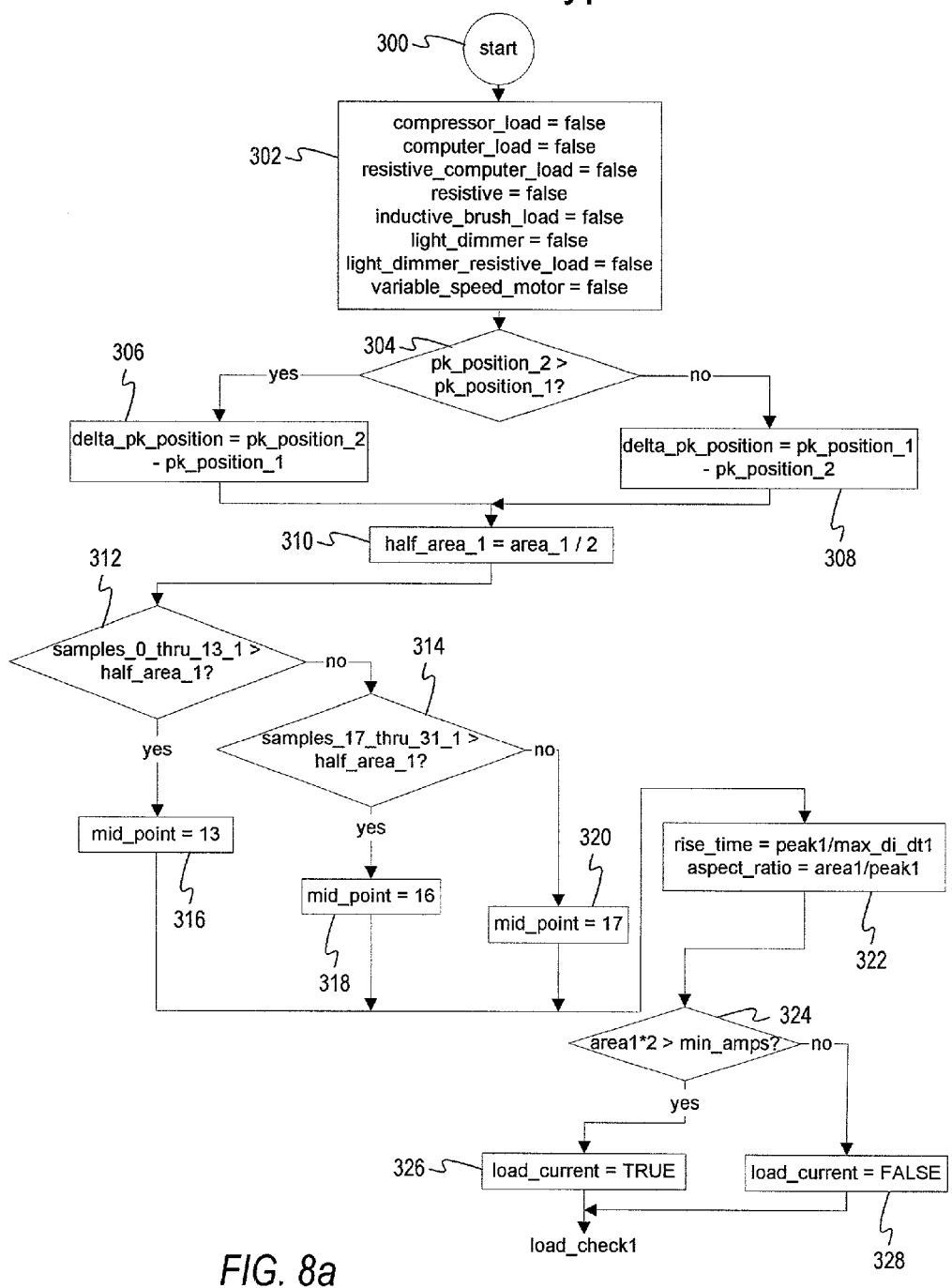
FIGS. 8a–8g show operation of a detect load type program.

Referring now to FIGS. 8a–8g, a detect load type routine is illustrated. At a start 300, all of the load type registers are set to false (302). As seen in FIG. 8a, the designated load types in the present embodiment are compressor load, computer load, resistive computer load, resistive, inductive brush load, light dimmer, light dimmer resistive load and variable speed motor. Other load types based on the same or other criteria may be designated or utilized without departing from the invention.

In accordance with the described embodiment of the invention, the microcontroller or microprocessor implements a number of counters in software. These counters are incremented and decremented in accordance with the detect load type routine, to be described presently, as well as in accordance with other routines, including an arc detection algorithm to be described later. The controller then determines, based upon the states of various counters or subgroups of counters not only the load type, from among the types given above, but also whether arcing is present. As will be seen presently, a different algorithm or different subroutines or portions of algorithms are used for each kind of load, once the type of load has been determined, to determine whether arcing is occurring based upon the sensor inputs obtained as described above. Thus, a number of counters or registers are incremented in accordance with the incoming sensor signals. These registers are used in various algorithms or subroutines to determine not only the load type, but the occurrence of arcing of a type and/or sufficient magnitude to cause a trip signal to be given, so as to trip a circuit breaker to an open position. As will become apparent from the ensuing description, the method of the invention also selects one of the load types as a default. In the present embodiment, the resistive load type is the default selection in the event that none of the other load types is determined to be present by the detect load type routine of FIGS. 8a through 8g.

Referring now more particularly to FIG. 8a, at 304 a peak position of the incoming waveform is monitored for the purpose of setting the absolute value for the peak position difference between half cycle 1 and half cycle 2 in a delta peak position register, at 306 and 308. There upon, a half area n register sets the area equal to one half of area n, the area under the waveform on the nth (e.g., first) half cycle 310. Thereupon the algorithm looks at a plurality of previously taken samples at 312 and 314 to determine an appropriate setting for a midpoint register at 316, 318 or 320. The midpoint register or counter count corresponds to the sample and the cycle at which the midpoint or spike in current occurs. Next, at 322 a rise time register is set equal to the ratio of peak 1 to maximum di/dt 1, i.e., of the first half cycle, and an aspect ratio register is set equal to the ratio of the area to the peak in the first half cycle. If two times the area in the first half cycle is greater than the value in the minimum amps register (324), load current is set true at 326. If not, load current is set false at 328.

Figure 8B:
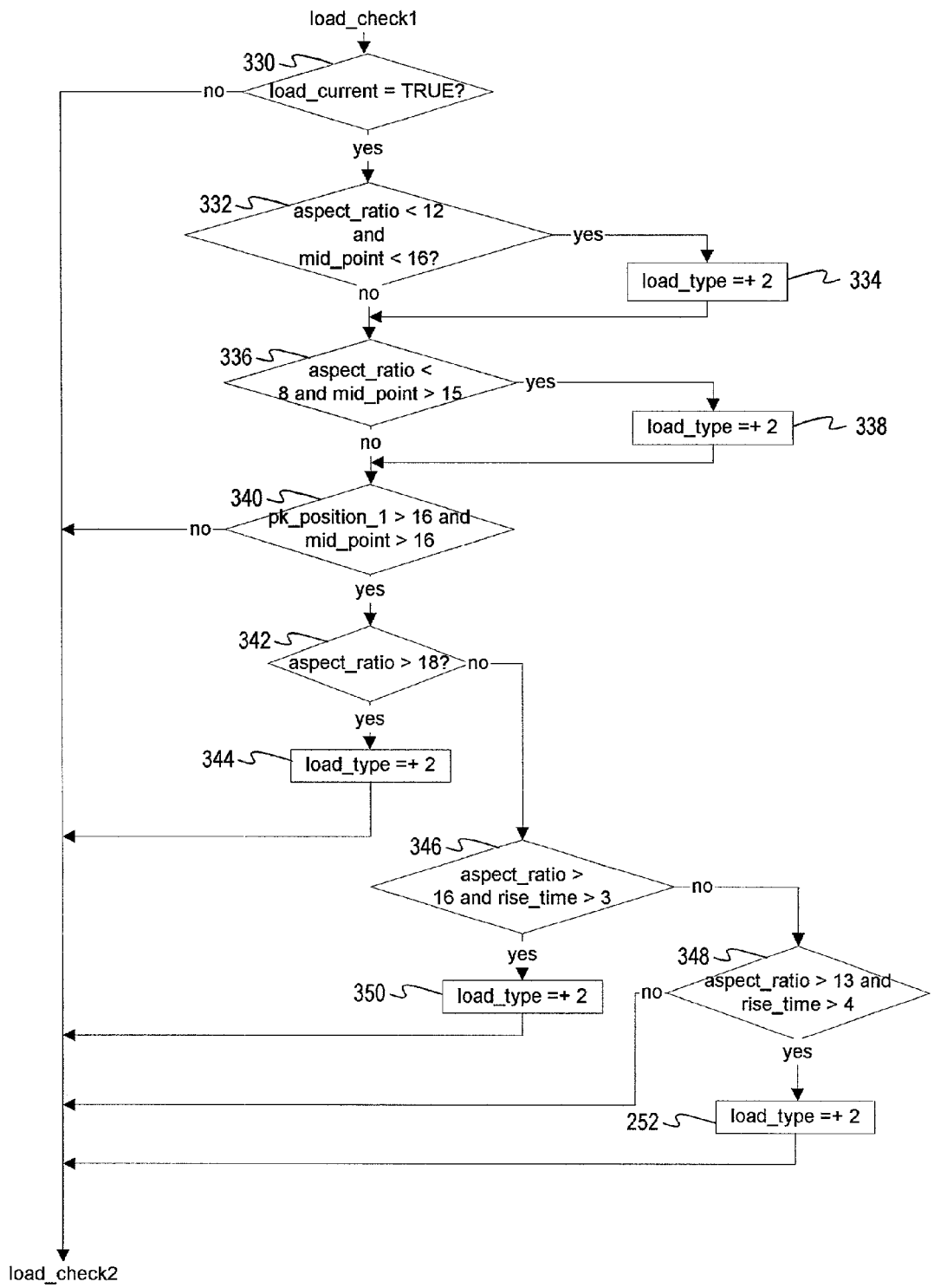

Continuing to FIG. 8b, if the load current is true 330, the values in the aspect ratio and midpoint registers are checked at 332 and the load type counter is incremented 334 if these registers are less than certain values. If not, aspect ratio and midpoint values are checked 336 and the load type register or counter is incremented by two at 338, depending on these values, if these values are not greater than or less than the selected quantities. Peak position and midpoint register values are read at 340 and if these values are greater than selected quantities, the aspect ratio register is read at 342, and if it is greater than a selected quantity, the load type register or counter is incremented by two at 344. The value in the load type counter may be utilized in other arc detection or load type algorithms, although it is not used in the present example. Additional checking of register values and incrementing of the load type register are illustrated at 346, 348, 350 and 352, whereupon the program proceeds to FIG. 8c. It will be noted that a "false" reading in the load current=true register 330 or a "no" at the peak position and midpoint readings 340 also direct the program to FIG. 8c.

Figure 8C:
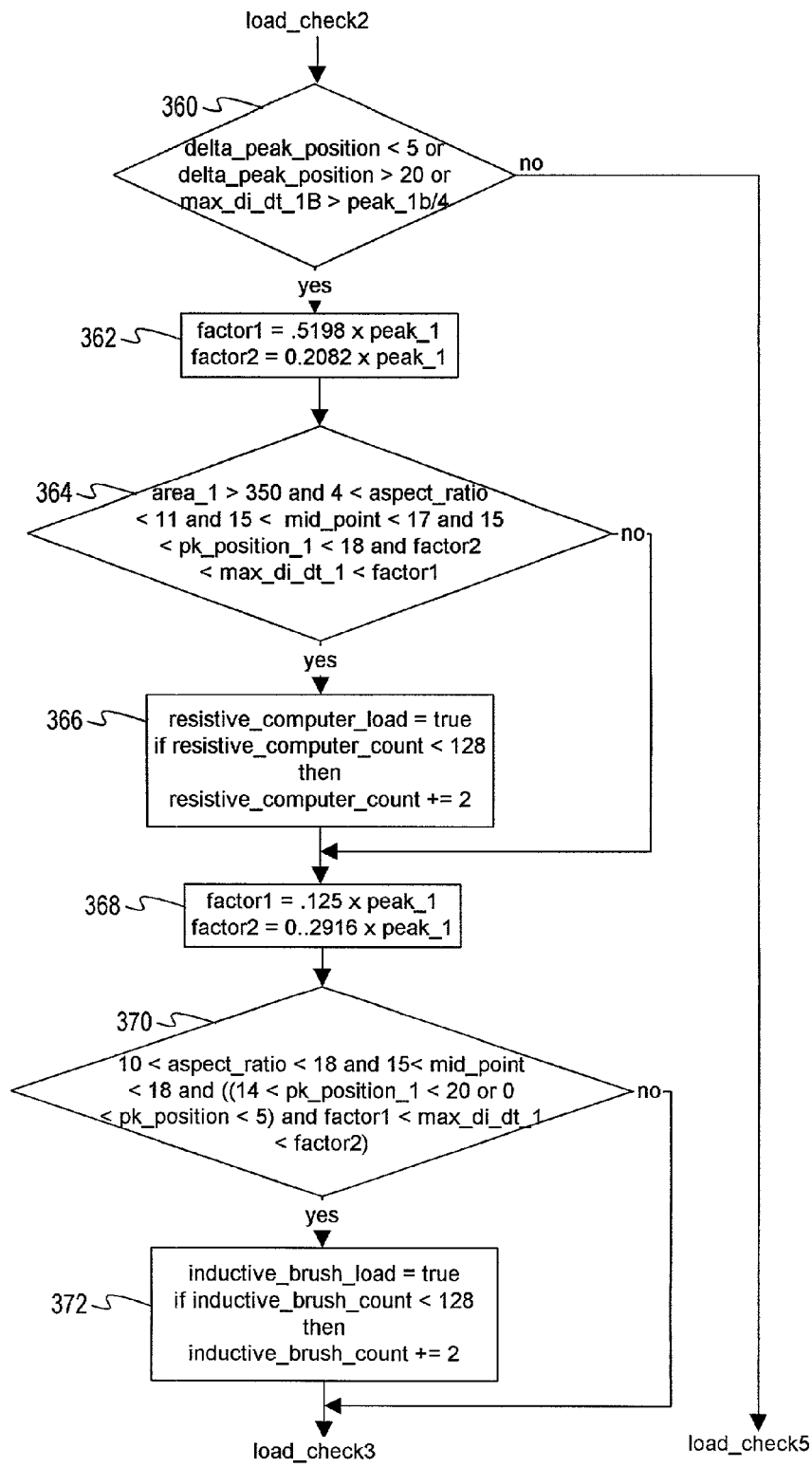

In FIG. 8c, a change in peak position, designated delta peak position between half cycles is determined by checking the delta peak position register and max di/dt 1B register at 360 for the maximum di/dt reading of a high current range sample (range B). If max di/dt B is greater than one quarter of the peak of half cycle 1, values are set into factor 1 and factor 2 counters at 362. If not, continue to FIG. 8f (load check 5). If the values are set into the factor registers 362, a number of other register values are tested at 364 and if within certain ranges, or above or below certain values, a resistive computer load register is set true and a resistive computer count is incremented, provided the resistive computer counter value is below 128 (see 366). If the conditions at 364 are not met, factor 1 and factor 2 counters are reset to new values at 368. Otherwise, this resetting takes place only after incrementing of the resistive computer count register or counter at 366. Thereupon, at 370 a number of other register values are checked and if meeting certain criteria, set an inductive brush load register true and increment an inductive brush counter (see 372) if it is below a maximum count, which in this embodiment is 128. The program then proceeds to FIG. 8d. If the conditions at 370 are not met, the program proceeds directly to FIG. 8d without incrementing the inductive brush count.

Figure 8D:
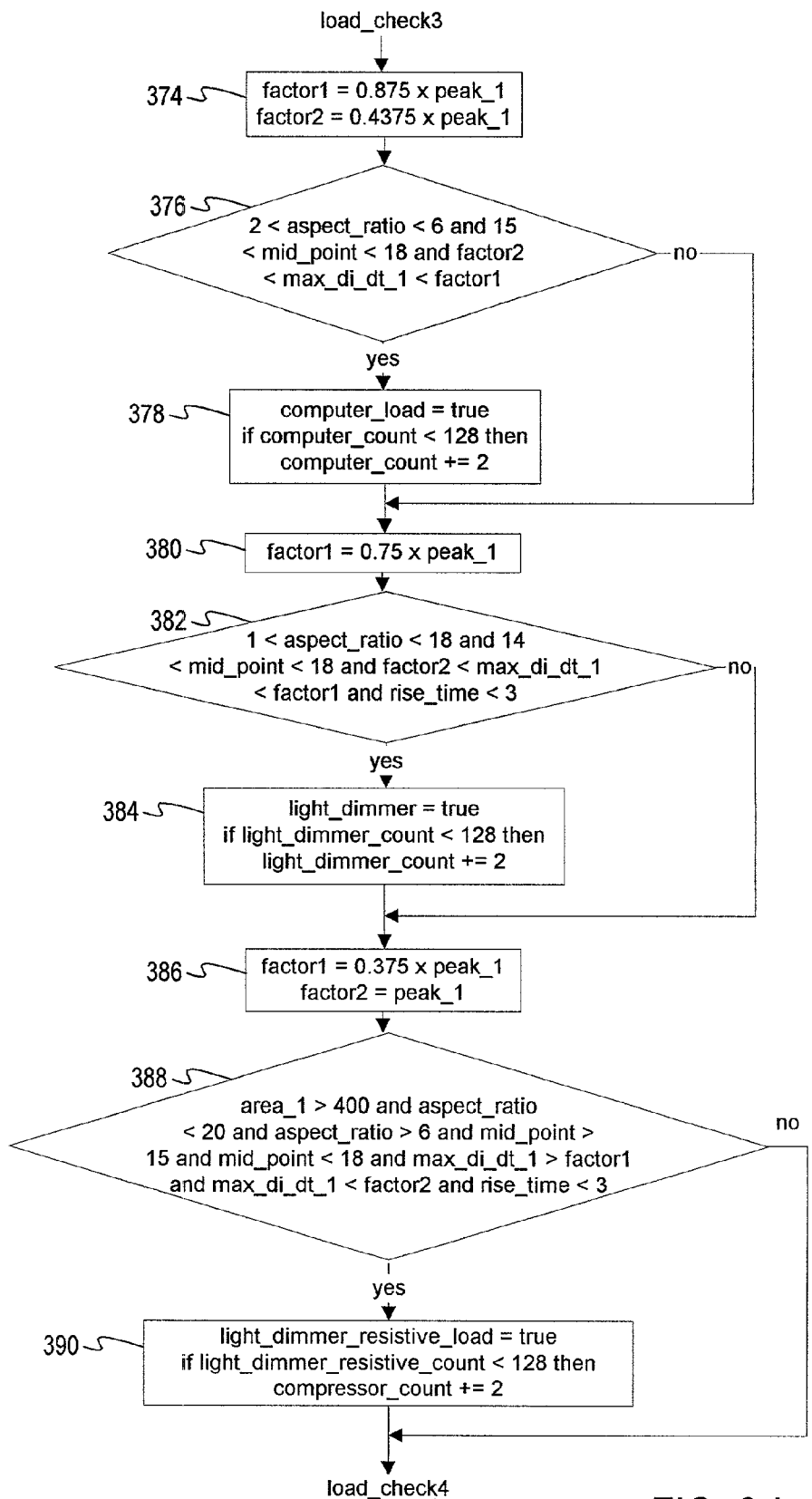
Figure 8E:
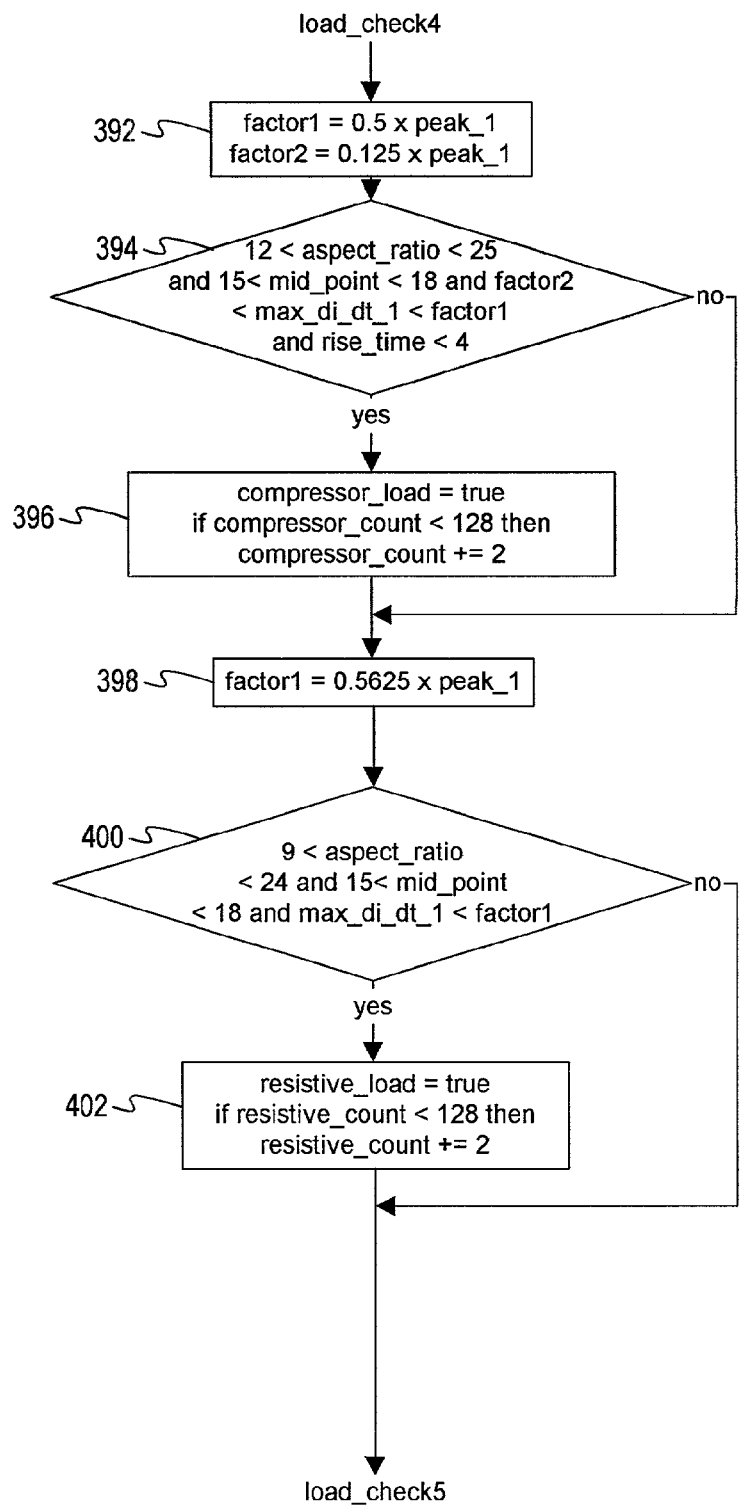

Referring now to FIG. 8d, the factor counters are reset to new values (374) for the next series of tests. At this point, it will be appreciated that the checking of counter contents shown in FIG. 8c will determine whether the load is to be designated as a resistive computer load or an inductive brush load, or if further checking to determine the load type is required. Accordingly, further checks are done in the same fashion in FIGS. 8d and 8e, after resetting the factor registers to new values. In this regard, different values are used in the factor registers for each of the load type tests, as will be seen from reviewing FIGS. 8c through 8e.

Accordingly, in FIG. 8d a computer load is set true and a computer load counter is incremented at 378 (if below its maximum) dependent upon conditions as shown at 376 of various counter or register values. If not, factor 1 is reset at 380 and a new series of counter tests is run to determine if a light dimmer type load is present at 384. If this is not the case, factor 1 and factor 2 are again reset at 386 and another series of counter criteria are used at 388 to determine whether a light dimmer resistive type load is present at 390. Similar tests are run in FIG. 8e and appropriate registers are set to true and counters are incremented as indicated at reference numerals 392 through 402.

Figure 8F:
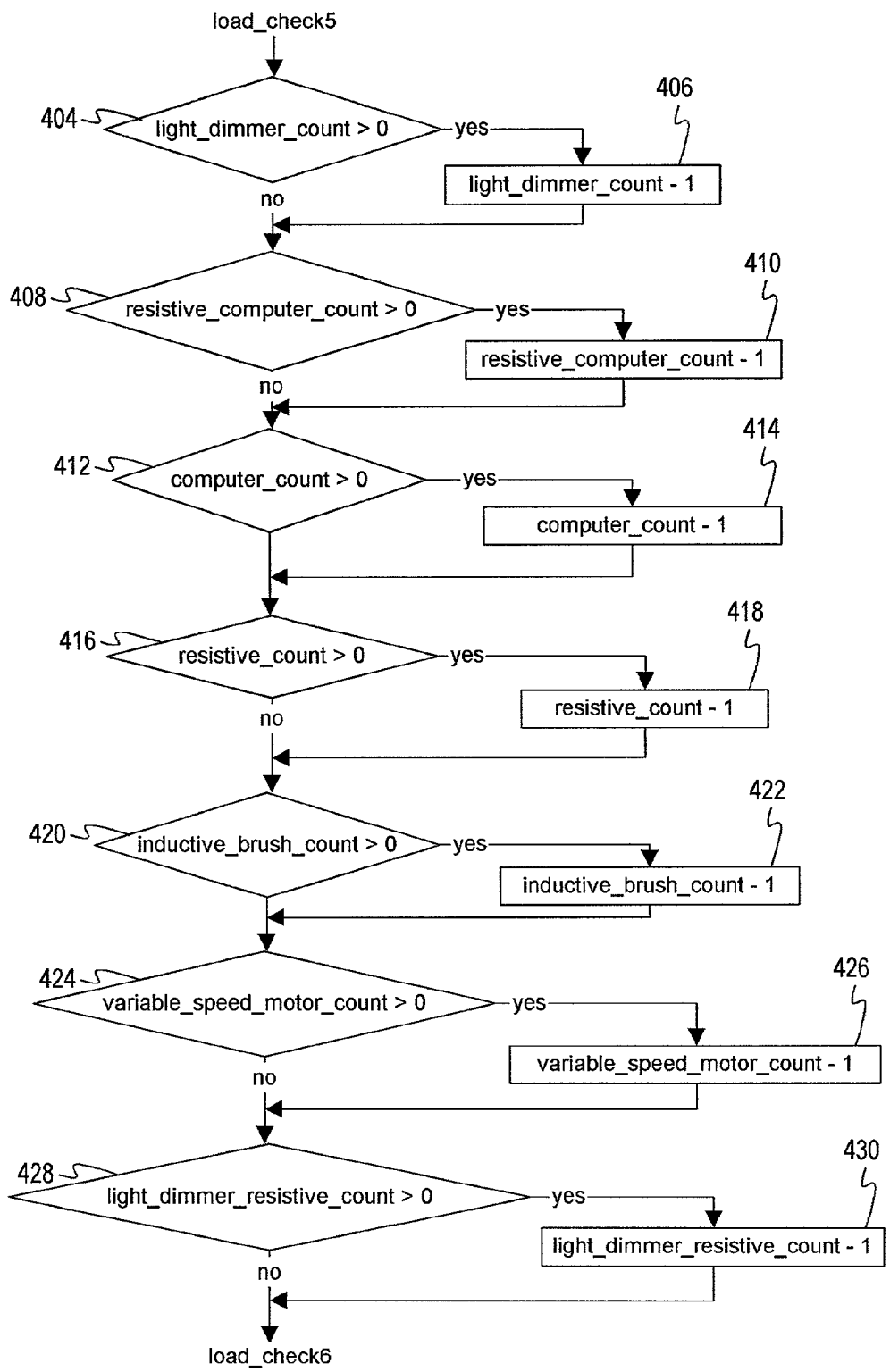

Referring next to FIG. 8f, in the present embodiment, the load type counters are essentially free running, and in order to prevent them from overflowing, they are all decremented by one count, assuming they are currently above zero. This is illustrated in the steps 404 through 430 shown in FIG. 8f and the compressor count is decremented at 432 and 434, in FIG. 8g.

Figure 8G:
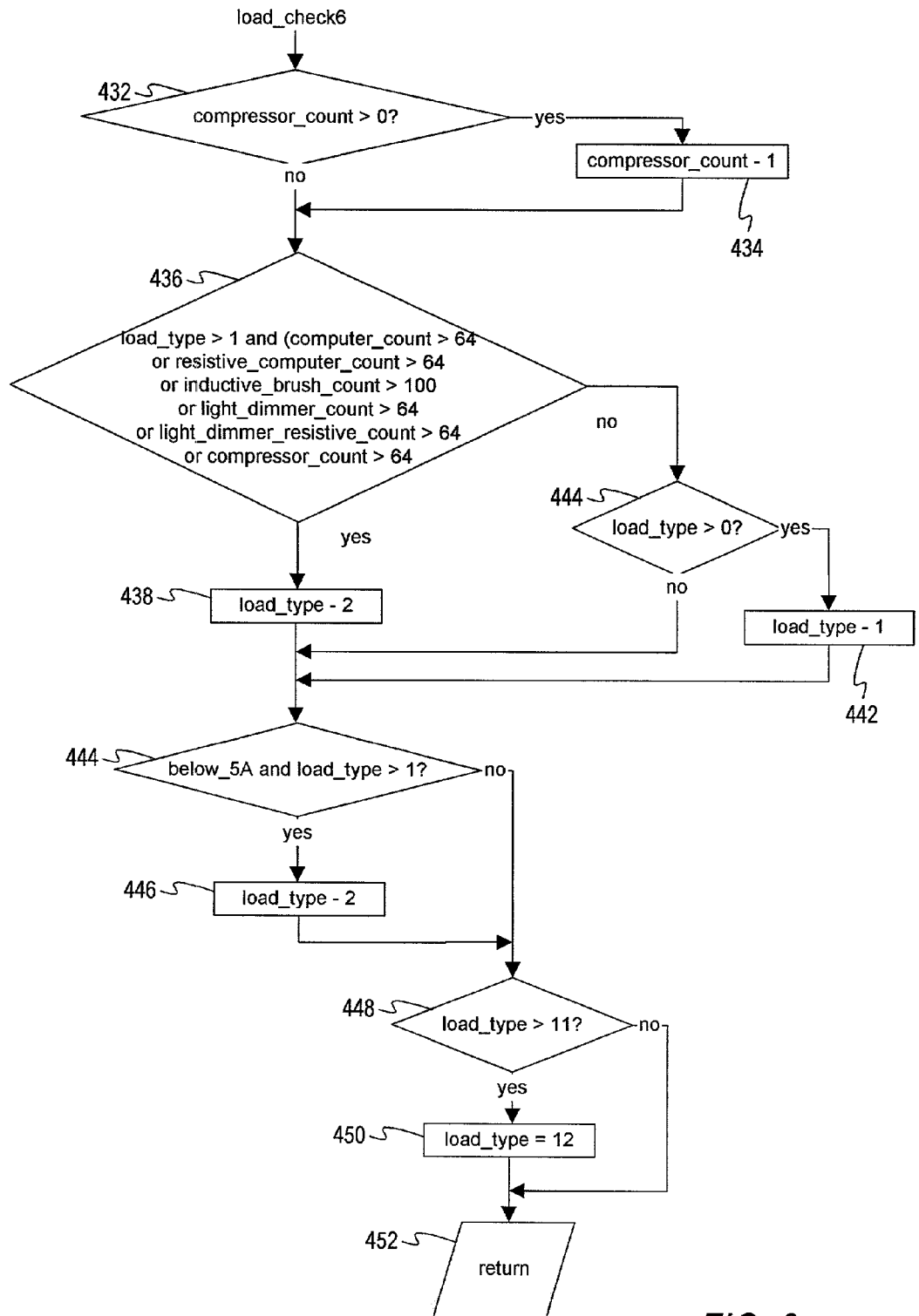

Proceeding to FIG. 8g, the counts in the counters for the various load type are checked at 436 along with the "load type" counter and if greater than certain values, the load type counter is decremented by two at 438 or, if not, and the load type counter is non-zero (440), the load type counter is decremented by one at 442. At reference numerals 444–450, further checks of the load type counter and a below 5A register (at 444) are run for either decrementing the load type counter (446) or for setting the load type counter equal to 12 (450), prior to a return command at 452.

Figure 9A:
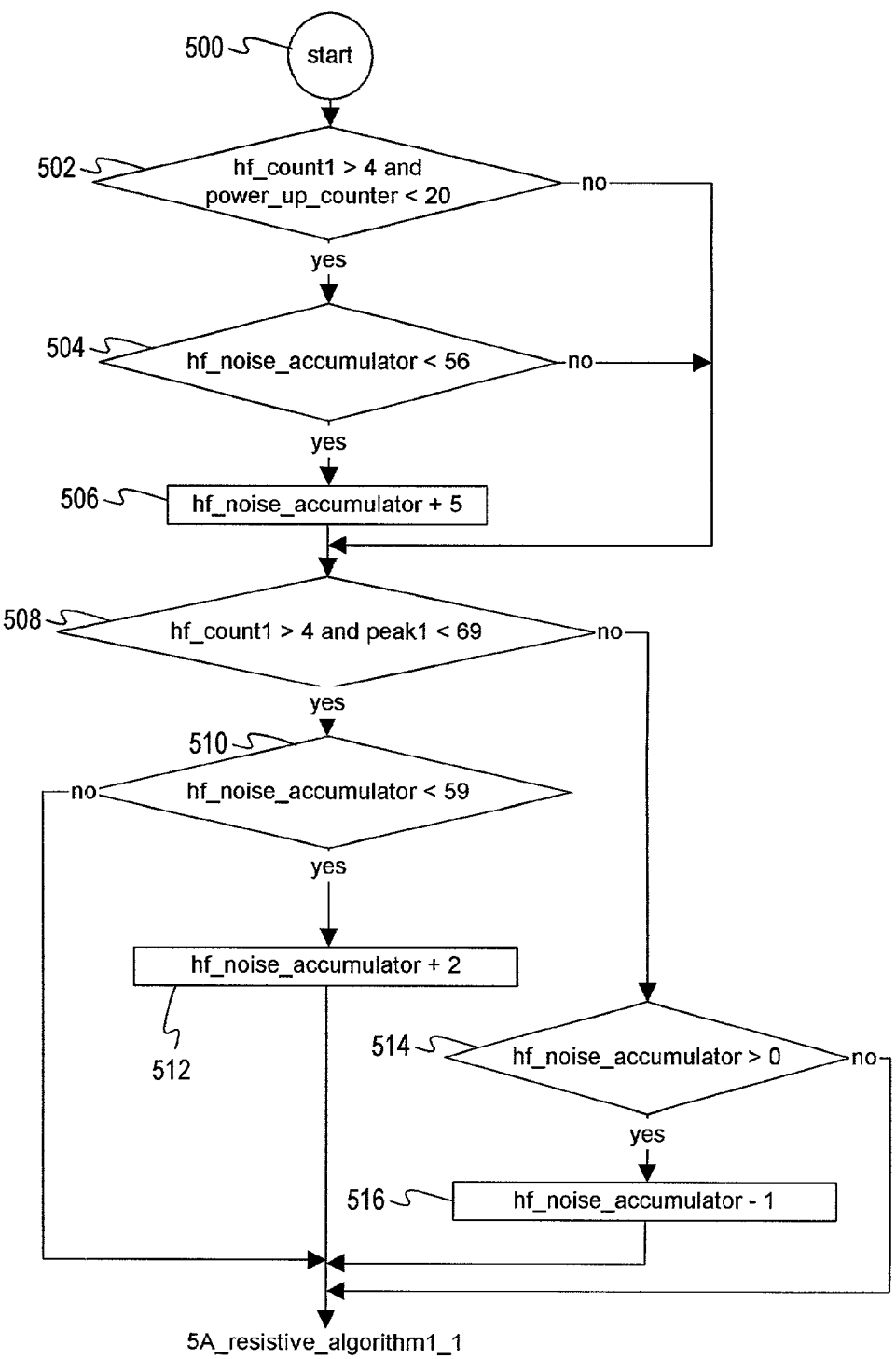
FIGS. 9a and 9b shows a flowchart of an over 5 amp resistive algorithm.
Figure 9B:
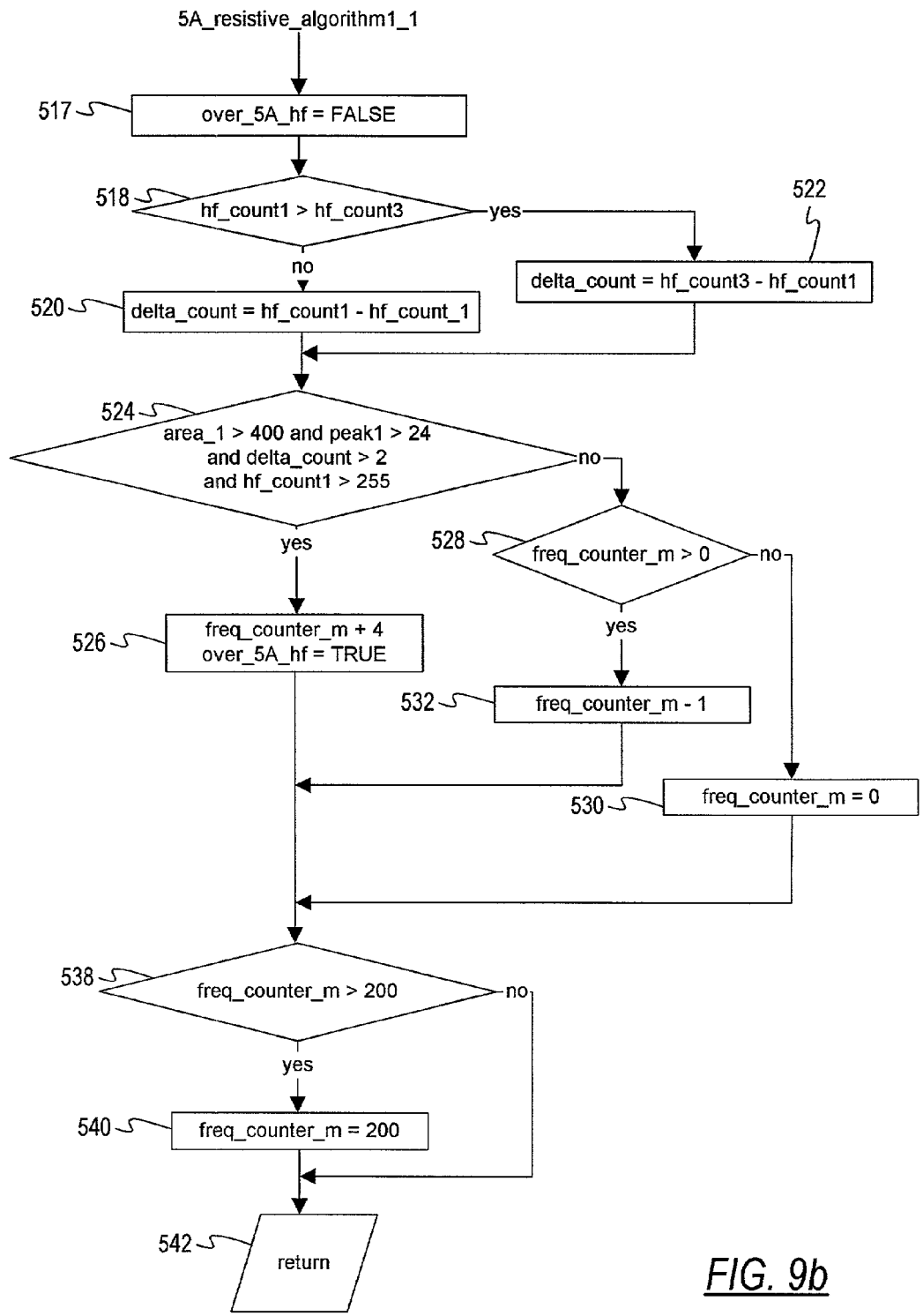
Figure 10A:
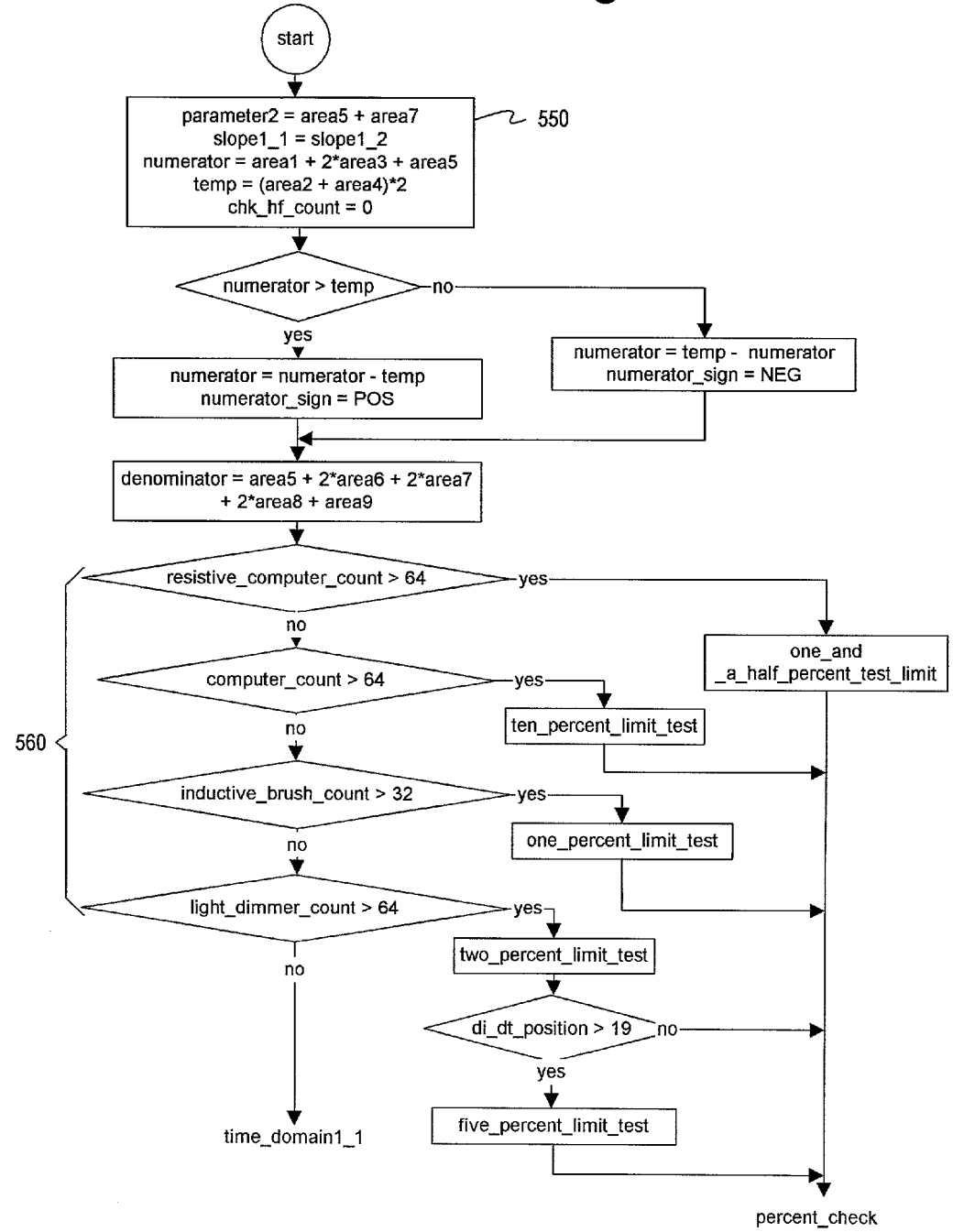
FIGS. 10a–10d are a flowchart showing operation of a time domain algorithm 1 program.
Figure 10B:
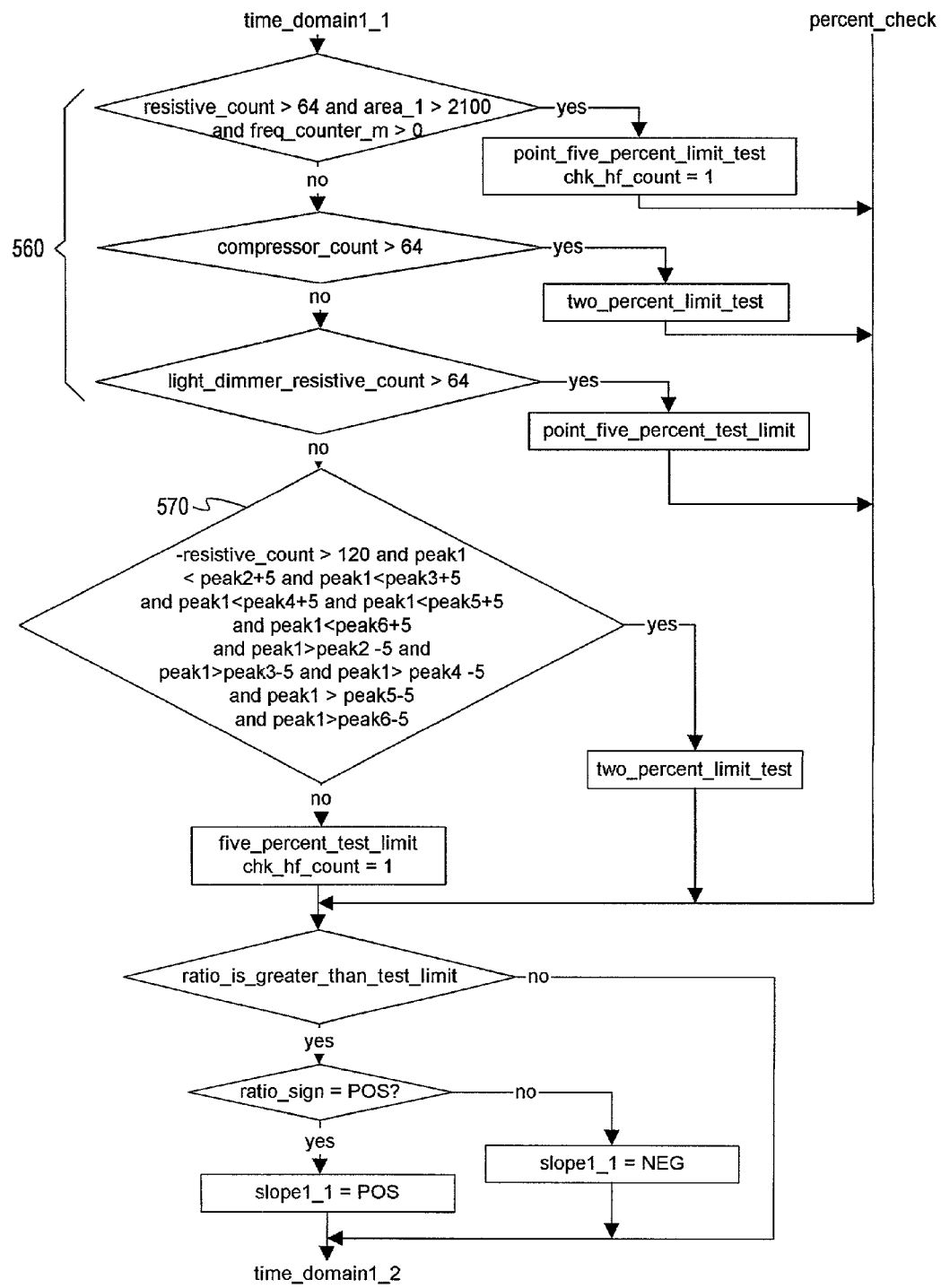
Figure 10C:
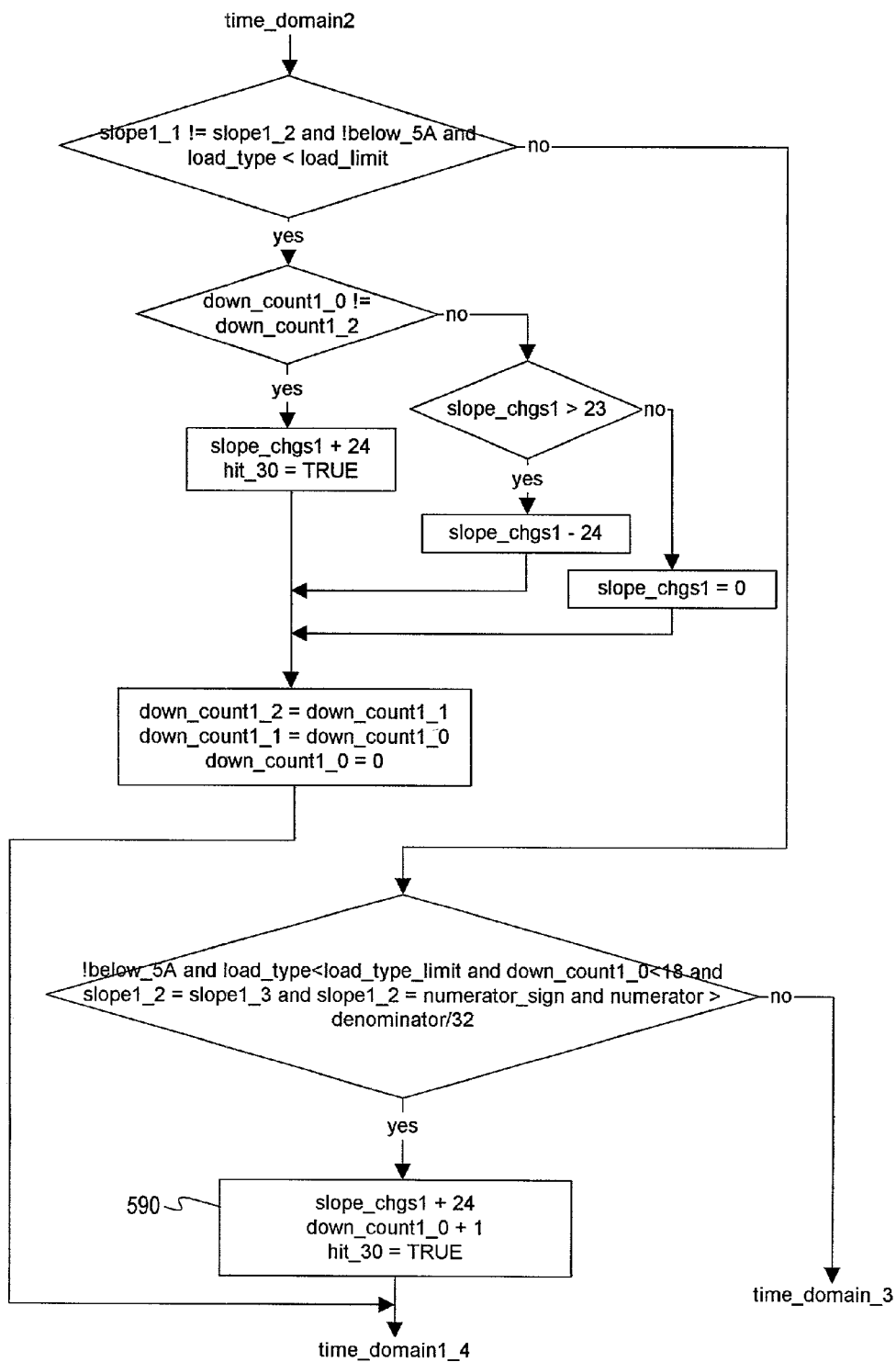
Figure 10D:
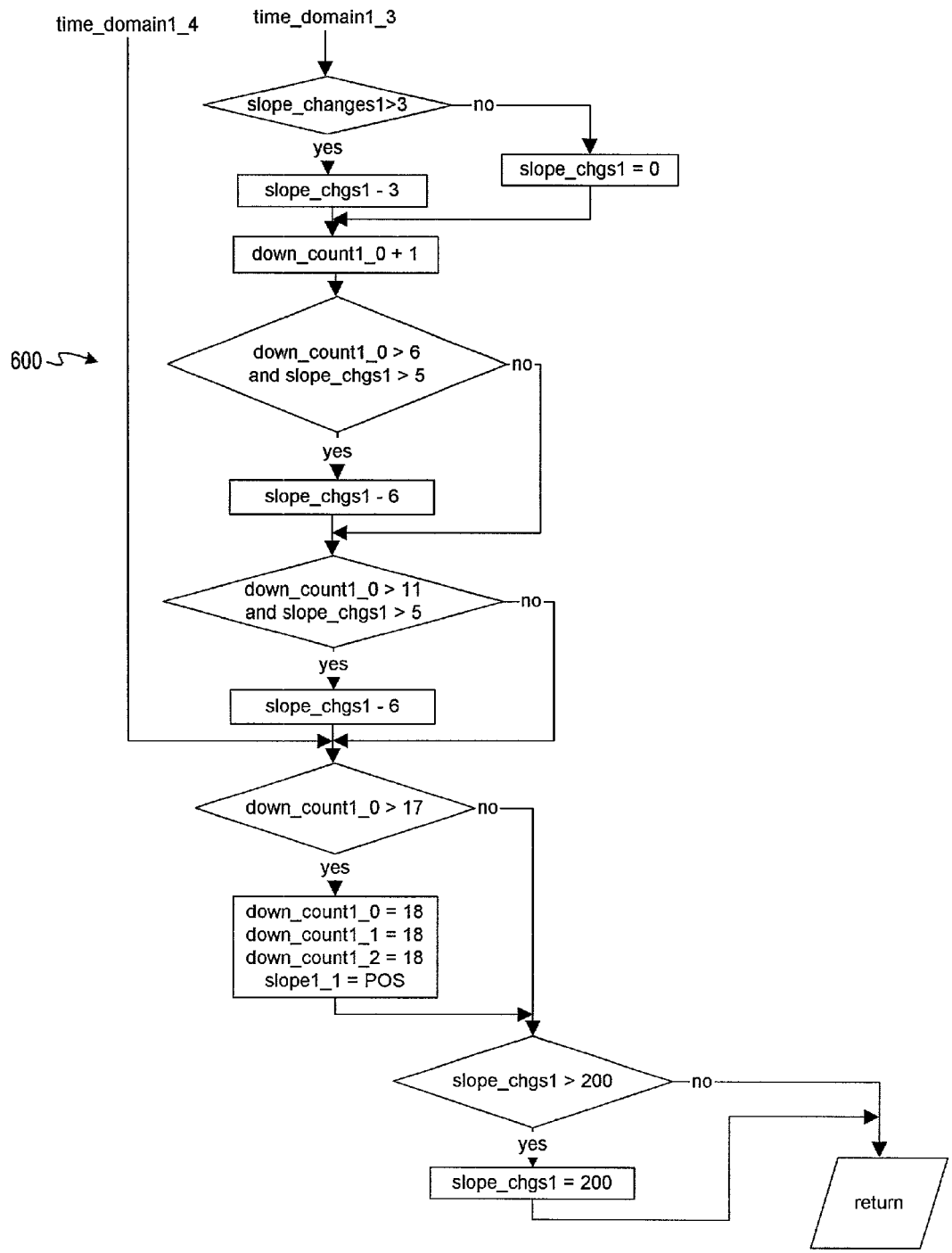
Figure 11A:
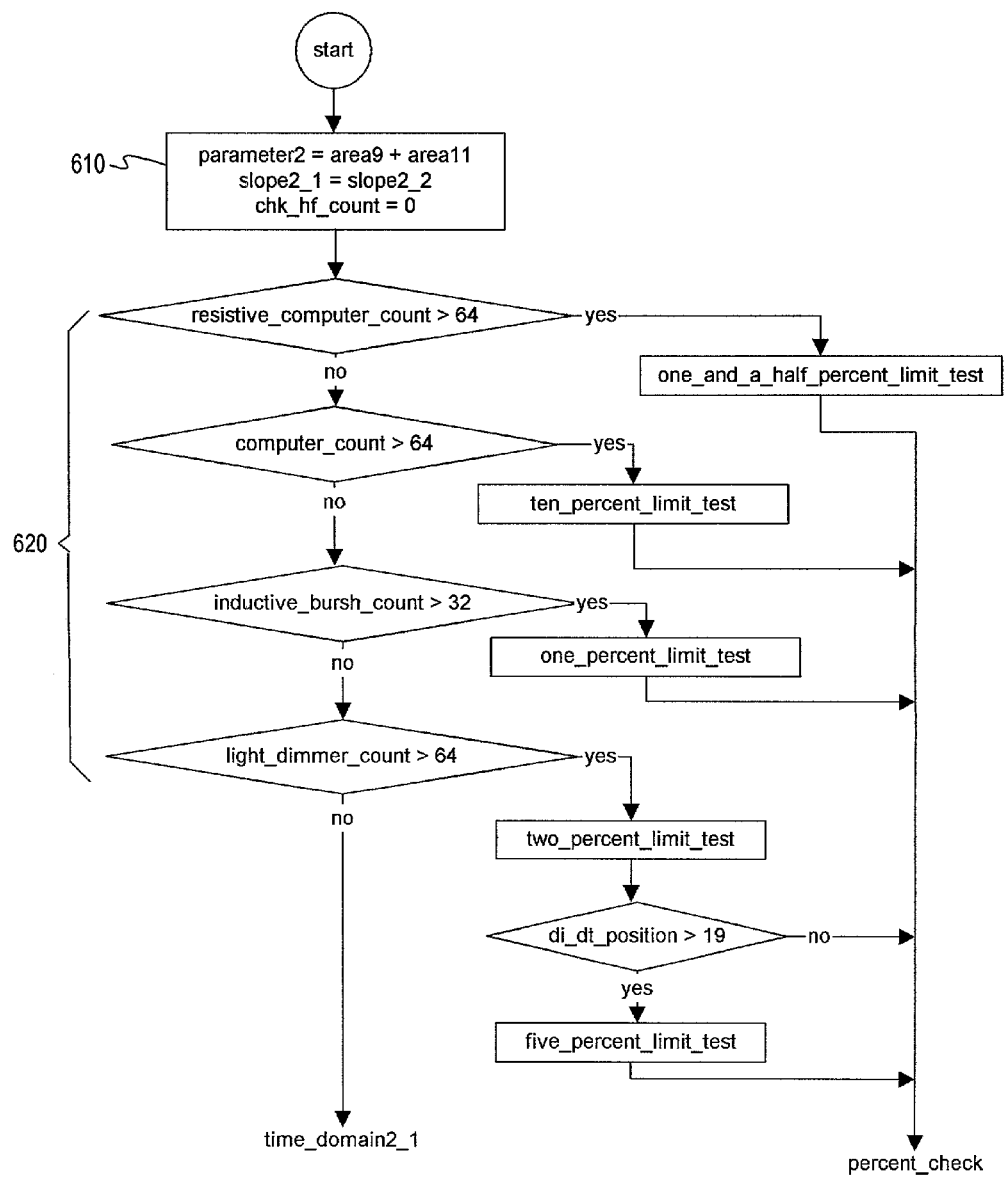
FIGS. 11a–11d are a flowchart showing operation of a time domain algorithm 2 program.
Figure 11B:
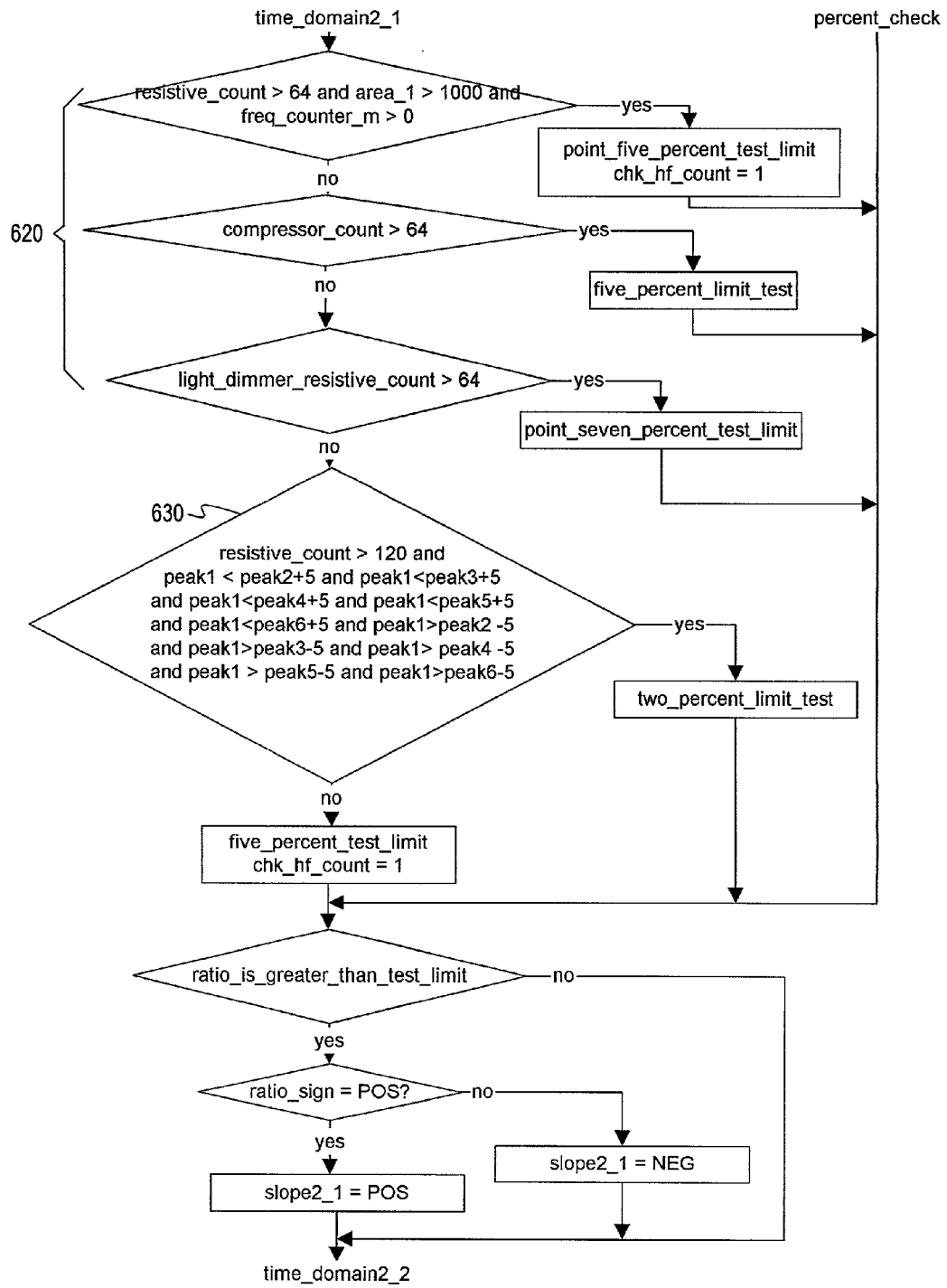
Figure 11C:
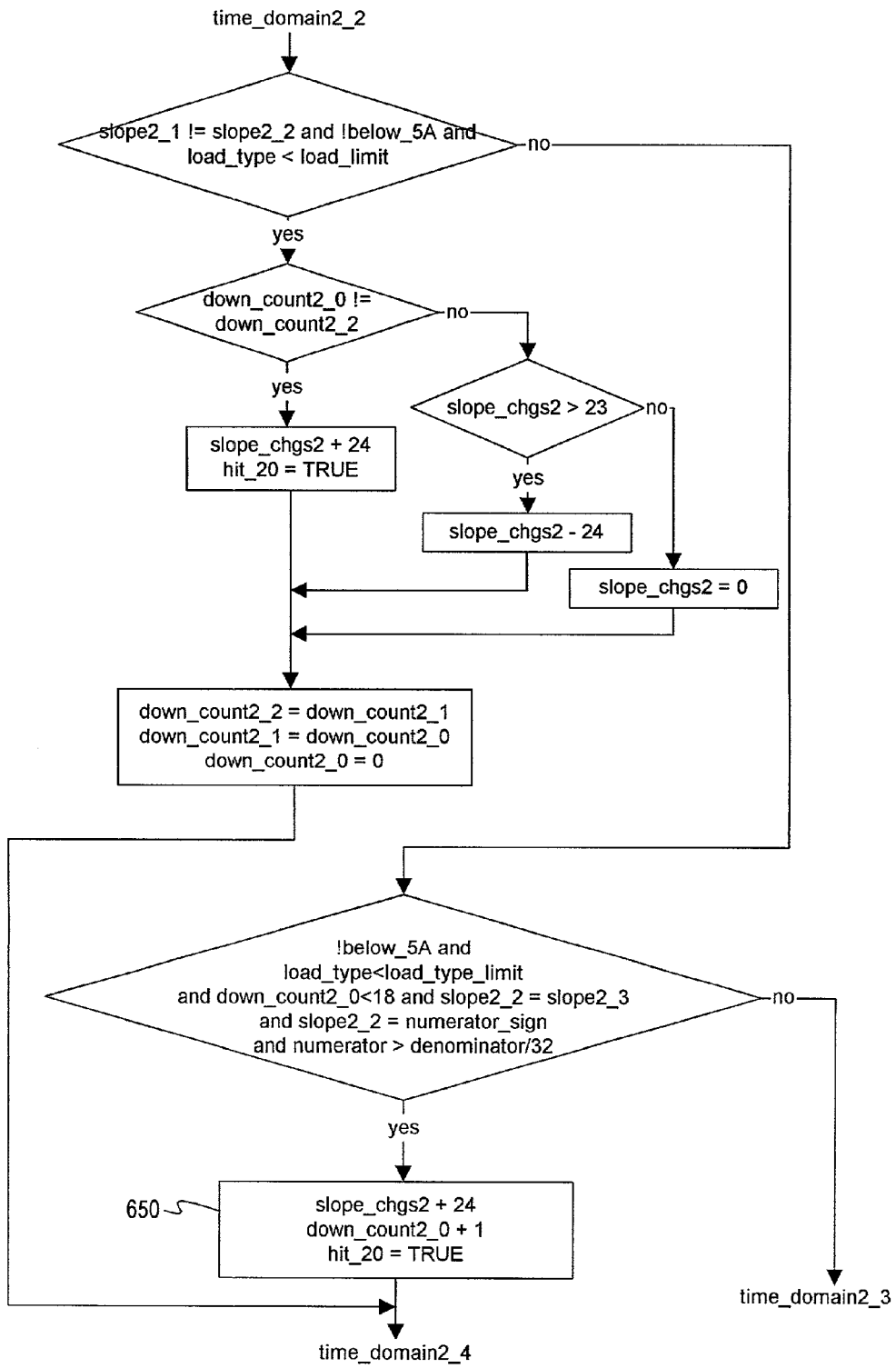
Figure 11D:
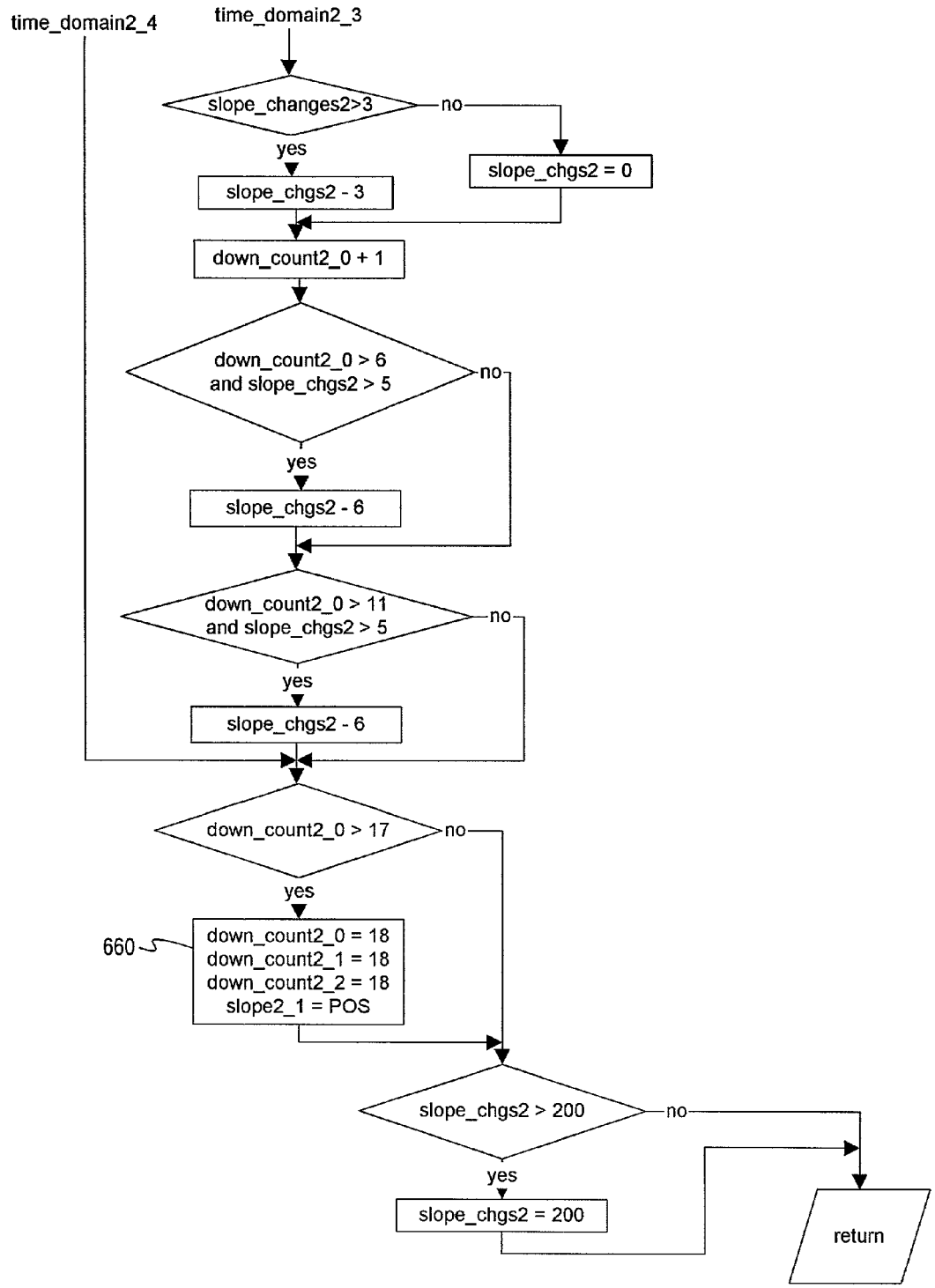
Figure 12A:
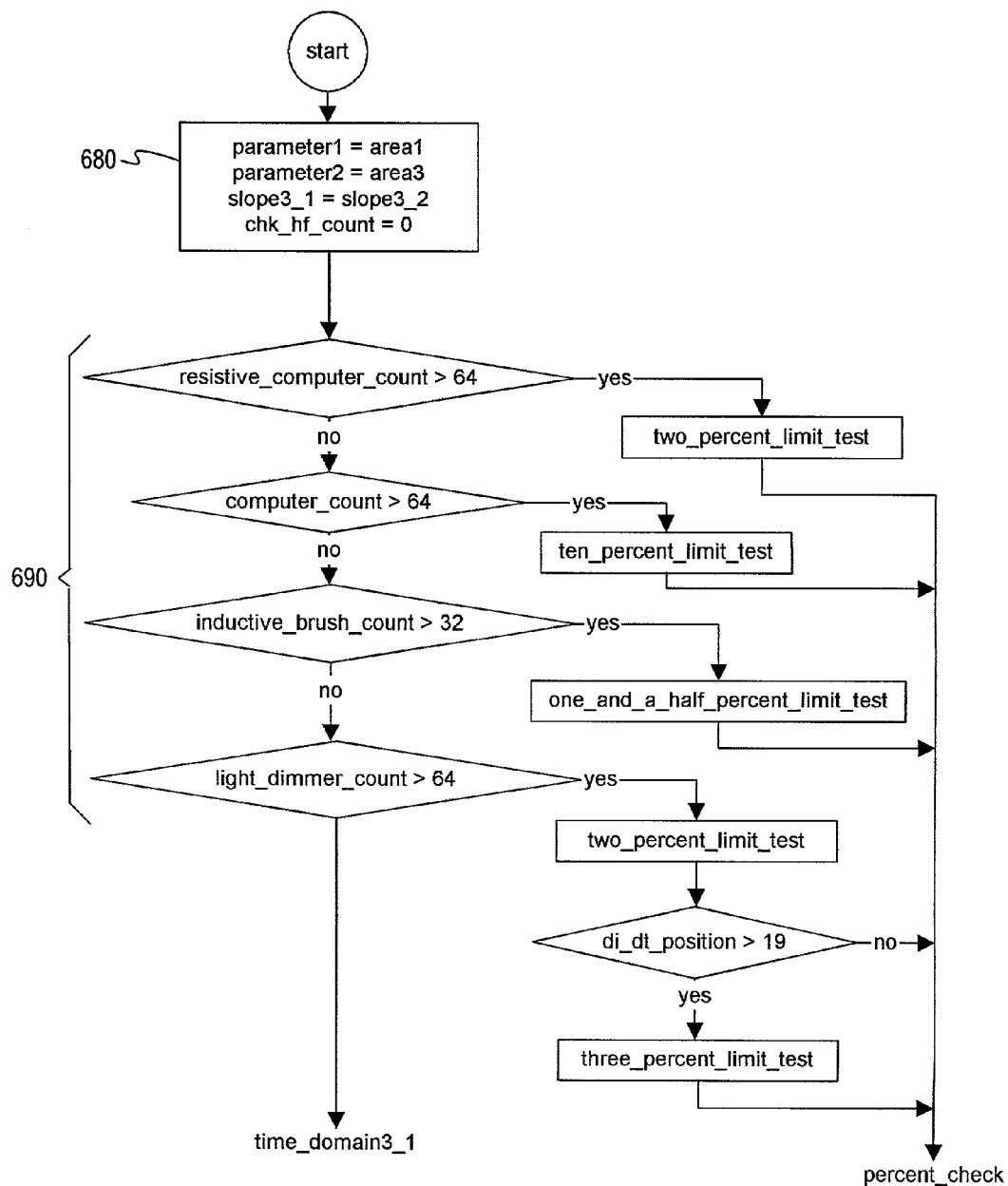
FIGS. 12a–12d are a flowchart showing operation of a time domain algorithm 3 program.
Figure 12B:
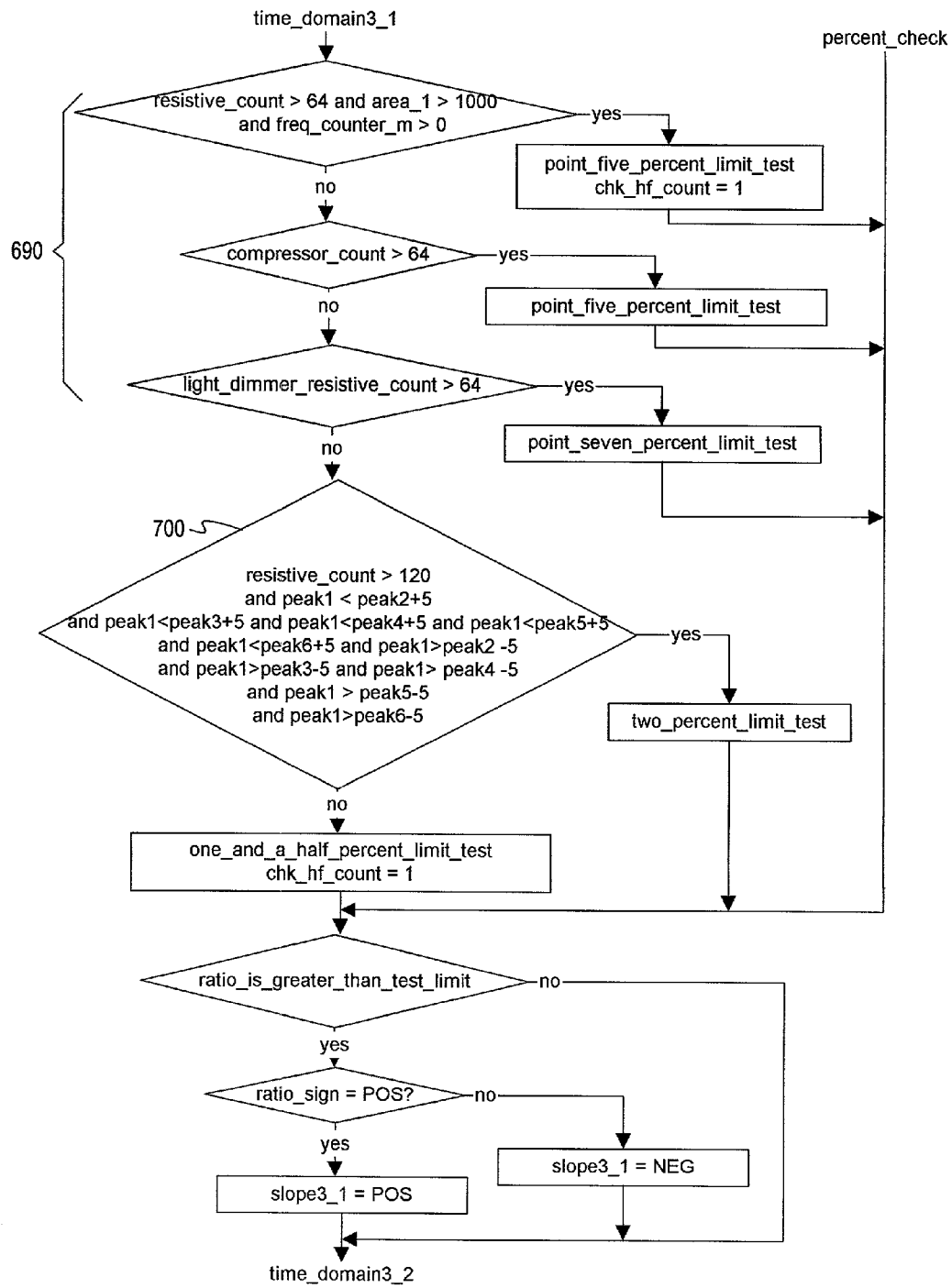
Figure 12C:
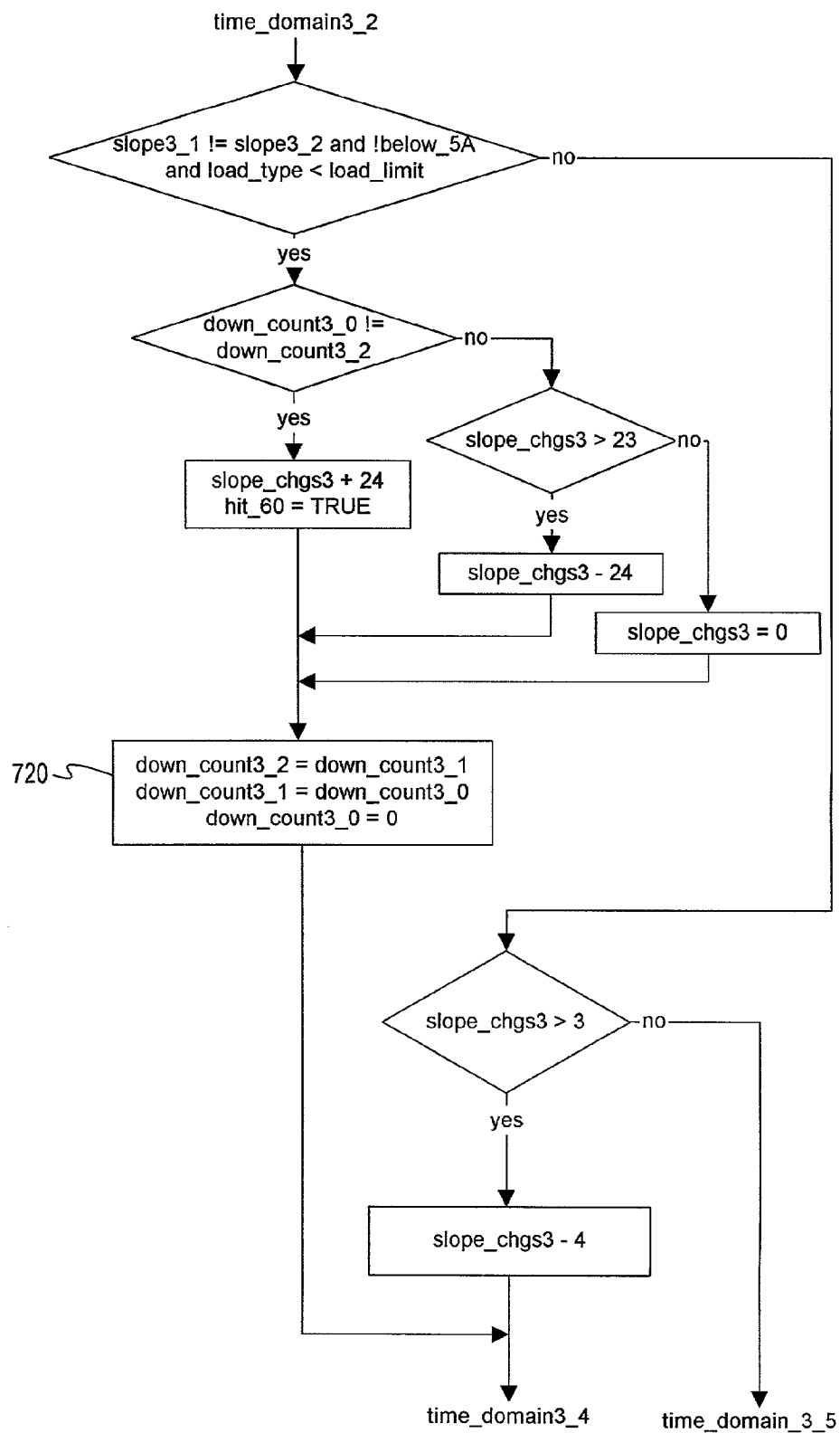
Figure 12D:
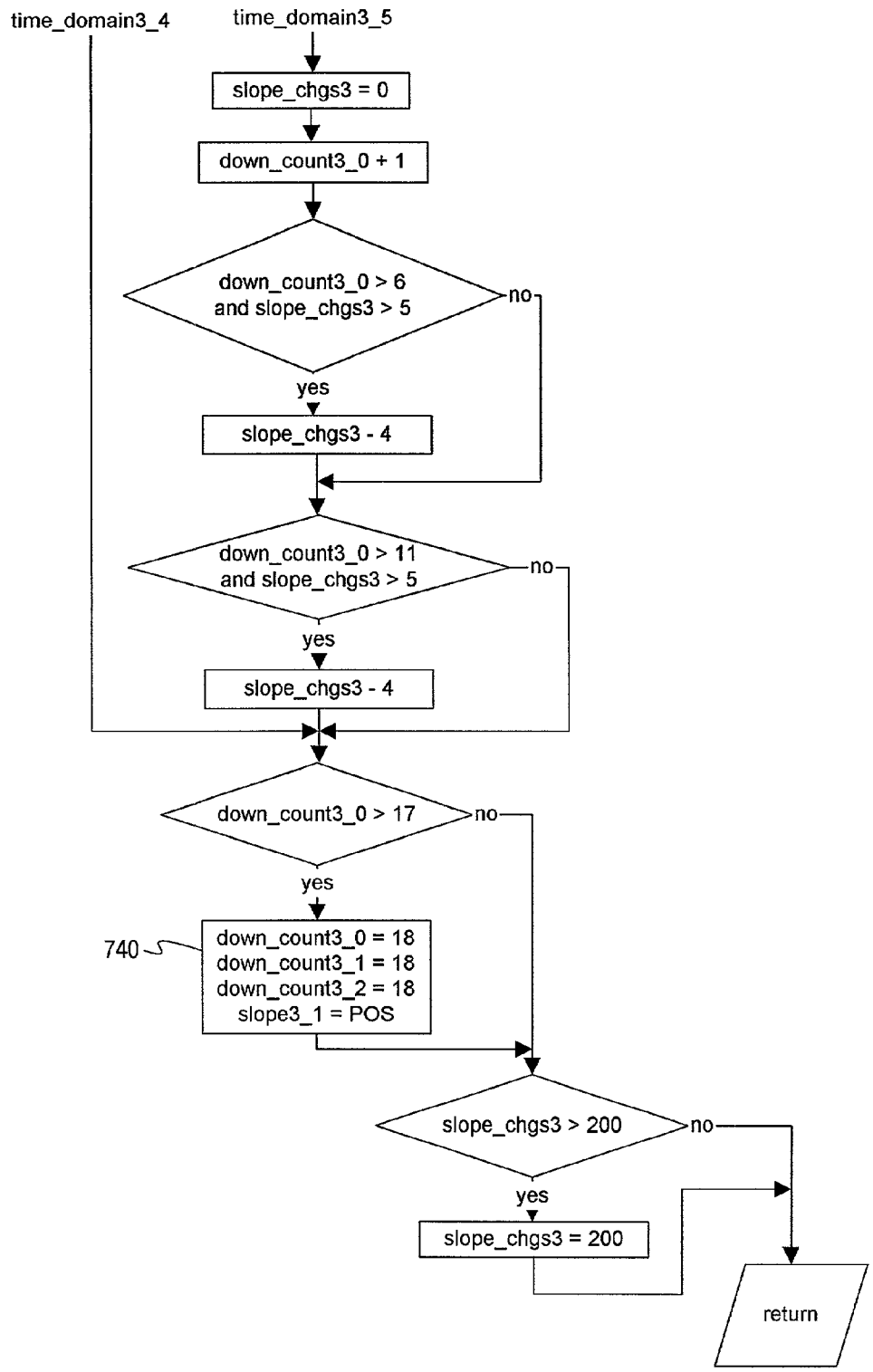

FIGS. 9a and 9b show the over 5 amp resistive algorithm 250. From the start 500, this algorithm monitors the condition of a number of counters as indicated at 502–510 following steps, and increments or decrements a high frequency noise accumaltor counter, as shown at 512–516.

In FIG. 9b, an over 5 amp high frequency register is set false at 517. The absolute value of the difference between a high frequency count at the first and third half cycles is then taken at 518–522 and the values in area, peak, delta and high frequency (hf) counts are checked at 524 to determine whether to increment (or decrement) a frequency counter or set the frequency counter at zero at 526–532. In the illustrated embodiment, the frequency counter is incremented by four for each 255 counts in the high frequency counter, thus acting essentially as a divider for accumulating additional high frequency counts. The maximum count permitted for the frequency counter in the described embodiment is 200 and this is implemented at 538 and 540.

FIG. 9a shows a part of the algorithm for type b or high currents, that is, those above the nominal handle rating of 15–20 amps in the illustrated embodiment. A 48 amp peak (33 amps RMS signal) is looked for in the algorithm. On the other hand, FIG. 9b shows a low current part of the algorithm, and in the illustrated embodiment, over 5 amps but within the "handle" rating of 15–20 amps. This represents a 5 amp or greater RMS peak being looked for by this algorithm.

FIGS. 10a–10d, 11a–11d and 12a–12d show three similar time domain algorithms. These algorithms are utilized for determining time domain properties of the load current, utilizing various criteria (550–600 in FIGS. 10a–10d, 610–660 in FIGS. 11a–11d, and 680–740 in FIGS. 12a–12d) for each of the various load types described above.

Figure 13:
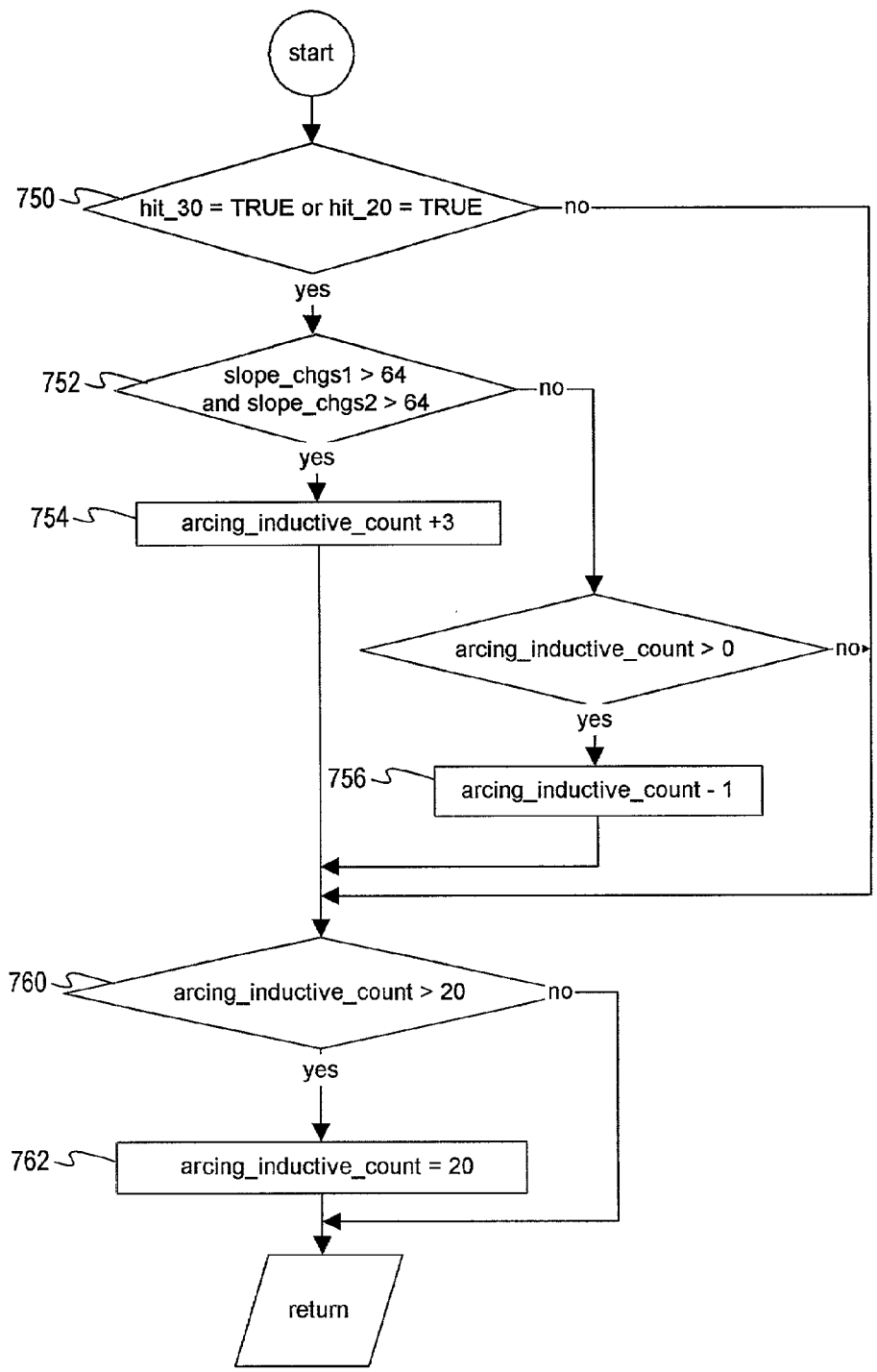
FIG. 13 is a flowchart showing operation of an inductive arcing timing program.

Referring now to FIG. 13, the inductive arcing timer algorithm 258 is shown in additional detail. This algorithm begins at 750 by checking the hit 30 and hit 20 registers for the true state. These registers were set to a true state if the 30 Hz or 20 Hz harmonics were found in the time domain 1 and 2 algorithms shown in FIGS. 10a–10d and 11a–11d. In this regard, the algorithm of FIGS. 12a–12d looks for 60 Hz harmonics. The inductive arcing timer algorithm then proceeds by checking the states of the slope changes counters and correspondingly incrementing or decrementing an arcing inductive counter at 752 and 754 or 756. Finally, if the arcing inductive counter has a count greater than 20, it is set equal to 20 at 760 and 762.

Referring to FIGS. 14*a*–14*g*, the trip equation (algorithm) 262 for the described embodiment of the invention is illustrated. The trip algorithm decides whether or not to cause the controller to produce a trip signal based on a check of the states of different ones and combinations of ones of the counters and the states of various registers that were incremented or set to true or false states in the previously described algorithms.

Figure 14A:
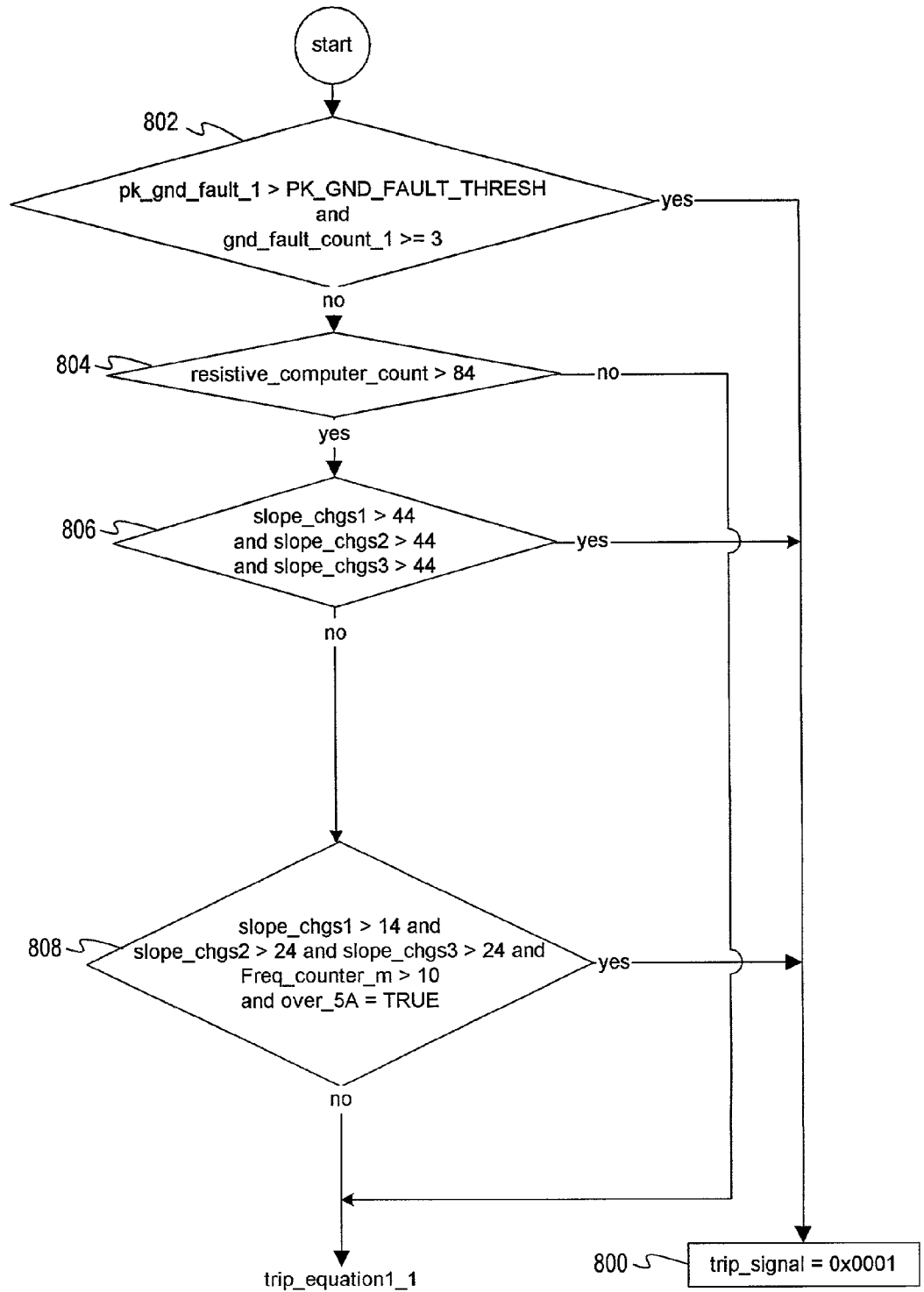
FIGS. 14a–14g are a flowchart showing operation of a trip equation program.

In FIG. 14*a*, a trip signal is set at 800 if one of several conditions is met. The first condition at 802 is a comparison of a peak ground fault counter to a peak ground fault threshold and the count in a ground fault counter. A second criteria is a minimum count in a resistive computer counter at 804 and minimum counts in several slope change counters at 806. The last of these conditions is minimum counts in several slope change counters and a frequency counter and the over 5 amp register being set true, as shown at 808. If the resistive computer count does not meet the minimum count indicated at 804, or if the requirements at 806–808 are not met, the program proceeds to test for an arcing fault based on a different load type, and in the illustrated embodiment an inductive brush load, by reading the contents of the inductive brush counter at 810 in FIG. 14*b*.

Figure 14B:
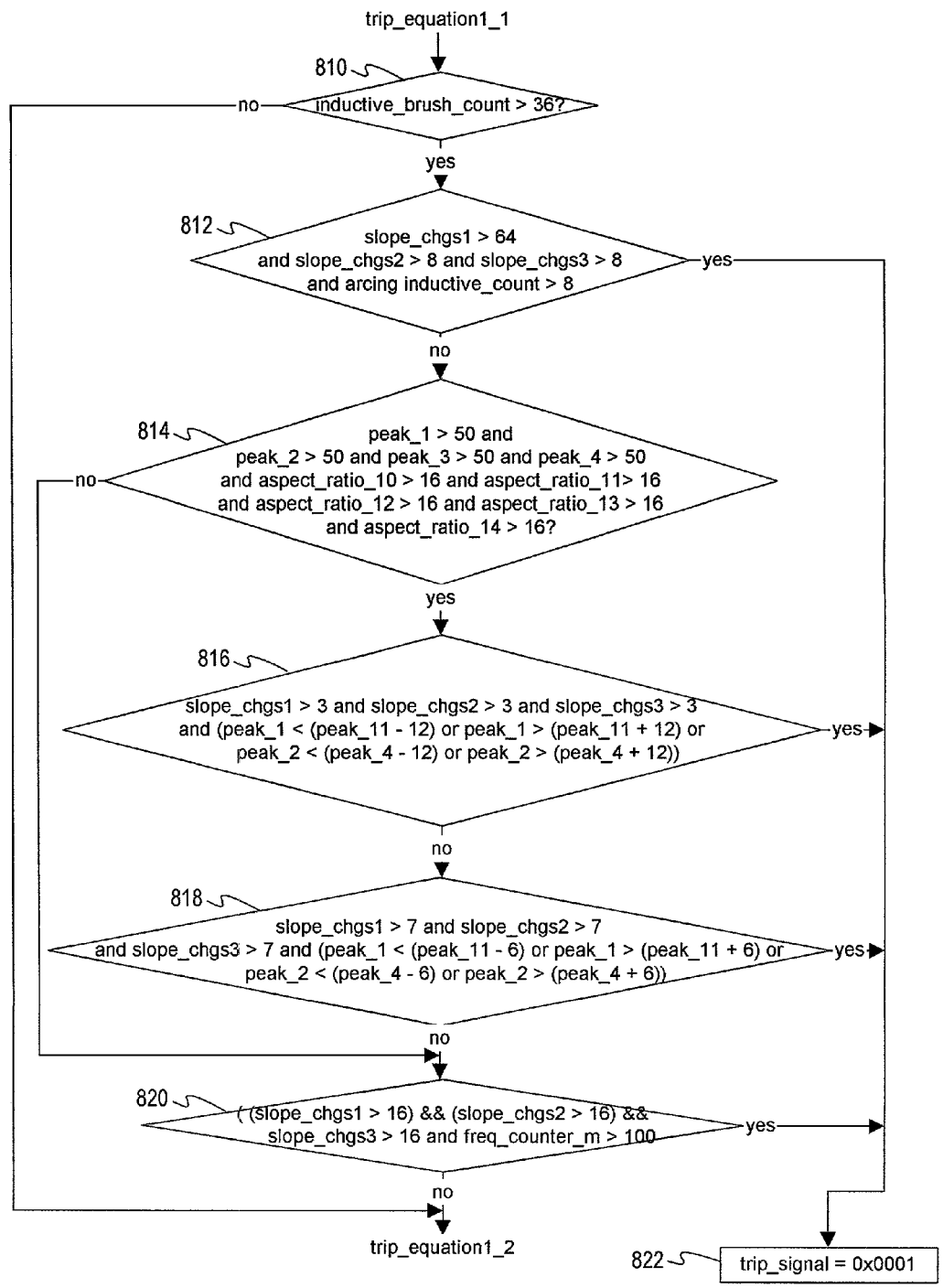
Figure 14C:
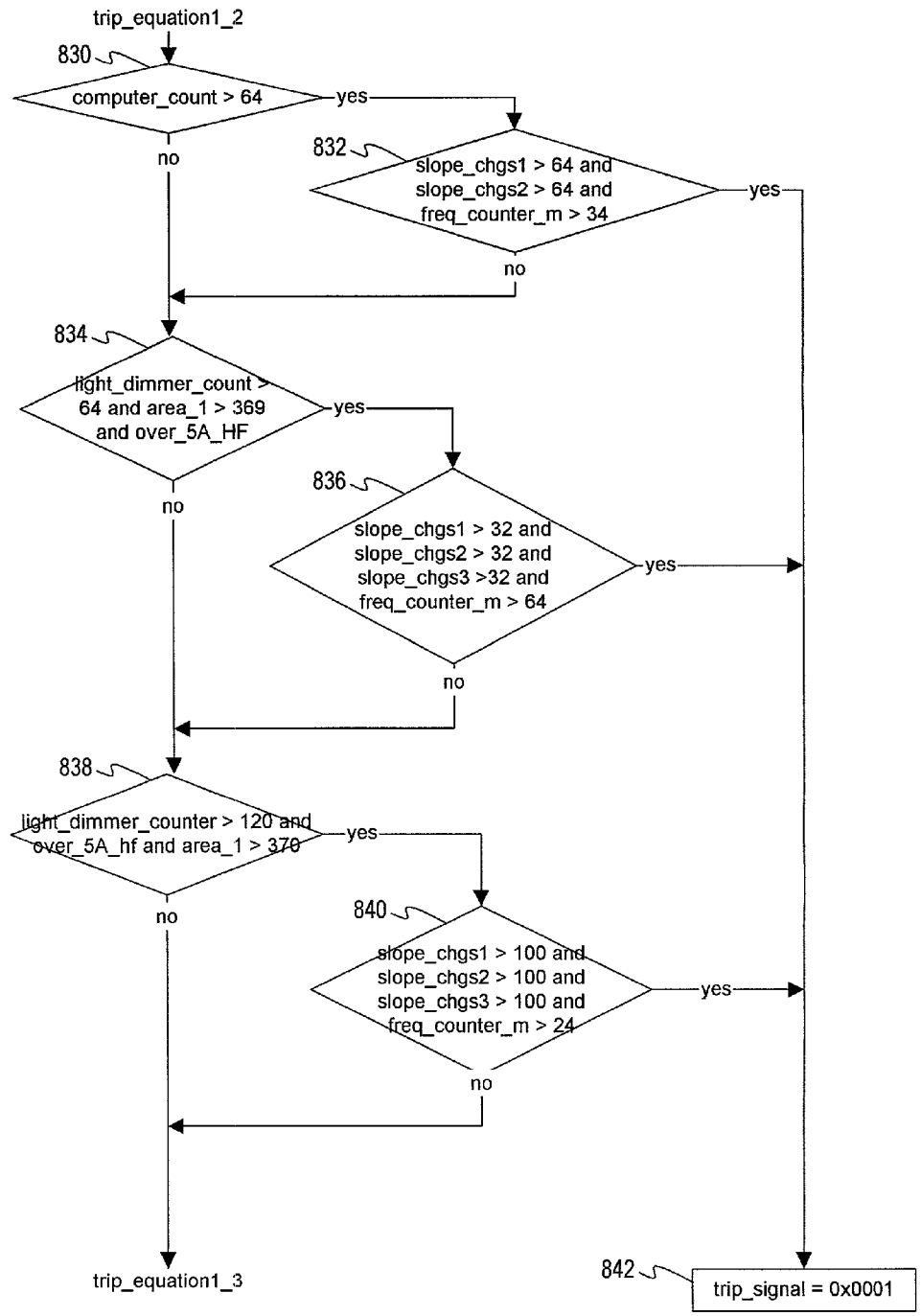
Figure 14D:
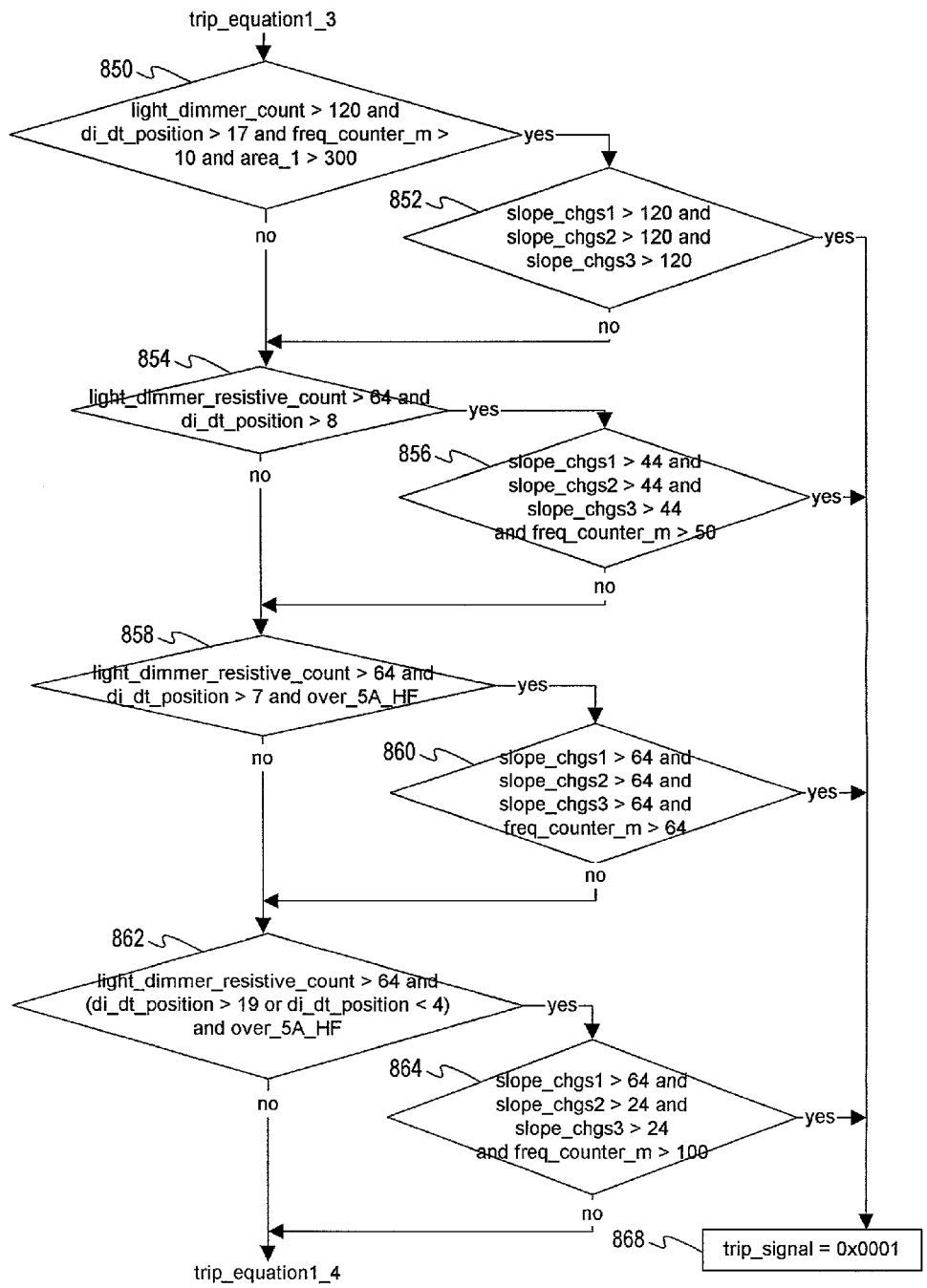

FIG. 14*b* shows a number of conditions which will cause the giving of a trip signal, including minimum readings in selected groups of counters, at steps 812 through 820. Some of these conditions, if met, will cause a trip signal to be set (822) as indicated in FIG. 14*b* and if not met, will cause the program to proceed to the next set of equations in FIG. 14*c*, which in the illustrated embodiment tests trip conditions for a computer load type, if the computer counter count is greater than 64 as indicated at 830. Continuing in FIG. 14*c*, a similar process takes place for a light dimmer load, initially reading a count in a light dimmer counter at 834, and thereafter reading the counts in various counters and combinations of counters (836–840) to decide whether to set the trip signal at 842 or proceed to FIG. 14*d*. Similarly, FIG. 14*d* begins with a check of the light dimmer counter and other selected counters at 850 and proceed with a chain of checks of various counter contents at 852–864 which, as indicated in FIG. 14*d* will result in either setting a trip signal at 868 or proceeding to FIG. 14*e*.

Figure 14E:
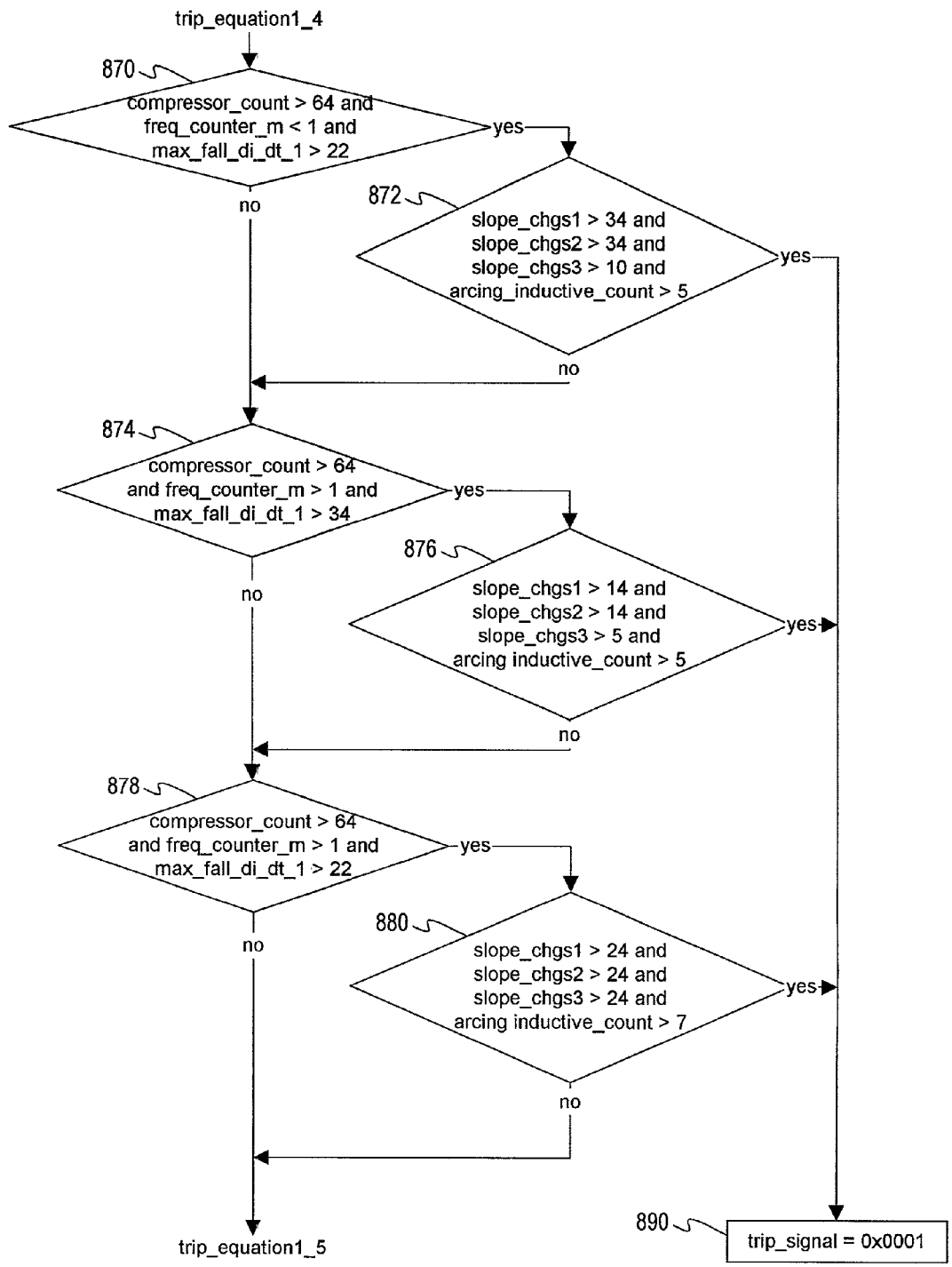
Figure 14F:
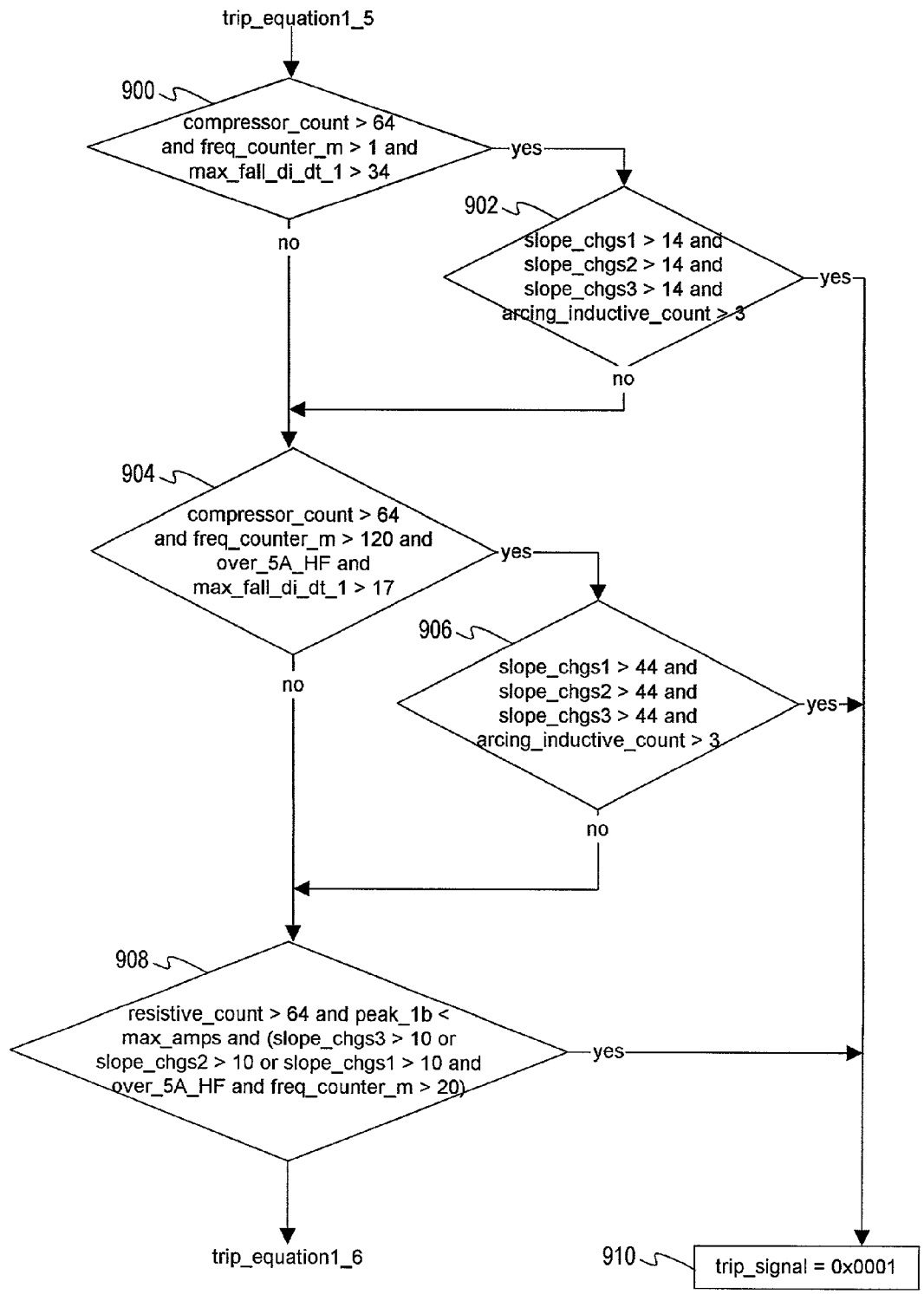

In FIG. 14*e*, a compressor count together with other selected counters are read at 870, and in similar fashion to the previously described figures the equation for arcing causes checking of various combinations of counters at 872–880 which will result in either setting a trip signal at 890 or proceeding to FIG. 14*f*. In FIG. 14*f*, a compressor count is read at 900, together with a frequency counter m and max fall di/dt counter. As with the foregoing trip equations, the trip equation of FIG. 14*f* proceeds through various subcombinations of counters with logic as indicated (902–908) to either set a trip signal at 910 or proceed to FIG. 14*g*.

Figure 14G:
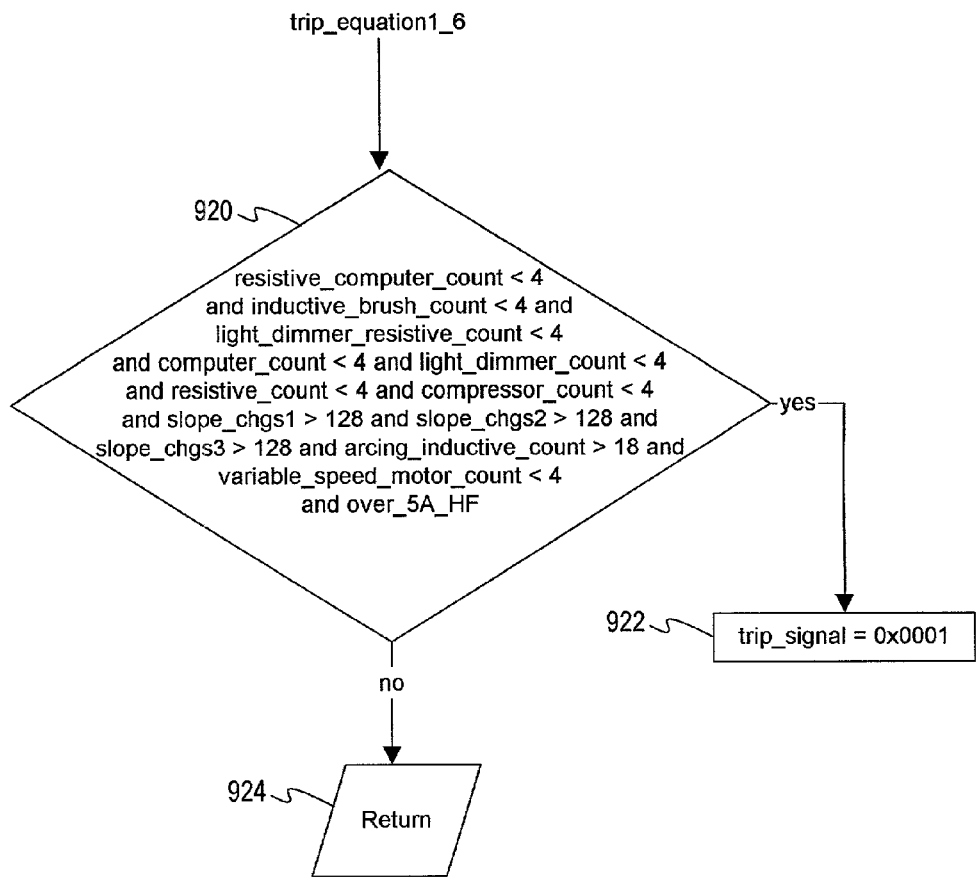

In FIG. 14*g* at 920, the counts of all of the counters associated with different load types as well as several other counters are read and a determination is made based on the contents of this group of counters whether to set the trip signal at 922 or proceed to the return command at 924.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A method of determining whether arcing is present in an electrical circuit comprising:
   sensing a change in current in said circuit and developing a corresponding input signal;
   analyzing said input signal to determine the presence of broadband noise in a predetermined range of frequencies, and producing a corresponding output signal;
   analyzing a line current at a sub-harmonic level; and
   processing said input signal, said output signal, and said sub-harmonic line current in a predetermined fashion and periodically determining whether an arcing fault is present in said circuit;
   said processing including determining a type of load connected to said electrical circuit, based at least in part upon said input signal and said output signal.

2. The method of claim 1 and further including producing a trip signal in response to a determination that an arcing fault is present in said circuit.

3. The method of claim 1 wherein said processing comprises incrementing one or more of a plurality of counters in a predetermined fashion in accordance with said input signal and said output signal and determining the type of load based at least in part on the states of one or more of said plurality of counters.

4. The method claim 1 wherein said processing comprises incrementing one or more of a plurality of counters in accordance with input signal and said output signal and periodically determining whether an arcing fault is present based at least in part on the states of said plurality of counters.

5. The method claim 3 wherein said processing comprises determining whether an arching fault is present based at least in part on the states of said plurality of counters.

6. The method of claim 5 wherein said counters are implemented in software.

7. The method of claim 1 wherein said processing further includes determining whether an arcing fault is present based at least in part upon the type of load determined to be connected to said electrical circuit.

8. The method of claim 4 wherein said processing further includes determining whether an arcing fault is present based at least in pan upon the type of load determined to be connected to said electrical circuit.

9. The method of claim 5 wherein said processing further includes determining whether an arcing fault is present based at least in part upon the type of load determined to be connected to said electrical circuit.

10. The meted of claim 4 wherein said incrementing and decrementing is further done in accordance with the type of load determined to be connected to said electrical circuit.

11. The method of claim 5 wherein said incrementing is further done in accordance wit the type of load determined to be connected to said electrical circuit.

12. The method of claim 1 wherein said determining a type of load includes selecting one of a plurality of load types, including compressor load, computer load, resistor load, resistive load, inductive brush load, light dimmer load, light dimmer resistive load, and variable speed motor mode.

13. The method of claim 3 wherein said determining a type of load includes selecting one of a plurality of load types, including compressor load, computer load, resistive computer load, resistive load, inductive brush load, light dimmer load, light dimmer resistive load, and variable speed motor load.

14. The method of claim 9 wherein said determining a type of load includes selecting one of a plurality of load types, including compressor load, computer load, resistive computer load, resistive load, inductive brush load, light dimmer load, light dimmer resistive load, and variable speed motor load.

15. The method of claim 12 wherein said determining a type of load includes designating one of said load types as a default selection in the absence of a determination of any one of said other load types.

16. The method of claim 13 wherein said incrementing and decrementing is performed in a different fashion for each of said load types.

17. The method of claim 5 wherein said incrementing and decrementing includes incrementing a separate one or more of said counters for each type of load.

18. The method of claim 17 wherein said incrementing and decrementing further includes incrementing a load type counter not associated with any of said load types.

19. The method of claim 14 wherein said incrementing and decrementing includes incrementing and decrementing a separate one or more of said counters for each of said load types.

20. The method of claim 4 wherein said determining whether an arcing fault is present includes using the states of selected ones of said plurality of counters for determining the presence of selected sub-harmonics in the current.

21. A system for determining whether arcing is present in an electrical circuit comprising:
a sensor for sensing cm-rent in said circuit and developing a corresponding sensor signal;
a sensor for sensing a change in the current in said circuit and developing a corresponding change in current signal;
a sensor for sensing line current at a sub-harmonic level;
a circuit for analyzing said sensor signal, said sub-harmonic line current, and said change in current signal to determine the presence of broadband noise in a predetermined range of frequencies, and producing a corresponding output signal; and
a controller for processing said sensor signal, said change in current signal, said sub-harmonic line current, and said output signal to determine current characteristics and a type of load connected to said electrical circuit and to determine, using said load current characteristics, the presence of broadband noise, and periodically determining whether an arcing fault is present in said circuit.

22. The system of claim 21, said controller further producing a trip signal in response to a determination that an arcing fault is present in said circuit.

23. The system of claim 21 wherein said controller increments one or more of a plurality of counters in a predetermined fashion in accordance with said sensor signal and said output signal and determines the type of load based at least in part on the states of one or more of said plurality of counters.

24. The system claim 21 wherein said controller increments one or more of a plurality of counters in accordance with said sensor signal and said output signal and periodically determines whether an arcing fault is present based at least in part on the states of said plurality of counters.

25. The system claim 23 wherein said controller periodically determines whether an arcing fault is present based at least in part on the states of one or more of said plurality of counters.

26. The system of claim 25 wherein said counters are implemented in software.

27. The system of claim 21 wherein said controller further determines whether an arcing fault is present based in part upon the type of load determined to be connected to said electrical circuit.

28. The system of claim 24 wherein said controller further determines whether an arcing fault is present based in part upon the type of load determined to be connected to said electrical circuit.

29. The system of claim 25 wherein said controller further determines whether an arcing fault is present based in part upon the type of load determined to be connected to said electrical circuit.

30. The system of claim 24 wherein said controller performs said incrementing and decrementing in accordance with the type of load determined to be connected to said electrical circuit.

31. The system of claim 21 wherein said controller selects one of a plurality of load types, including compressor load, computer load, resistor load, resistive computer load, inductive brush load, light dimmer load, light dimmer resistive load, and variable speed motor load.

32. The system of claim 23 wherein said controller selects one of a plurality of load types, including compressor load, computer load, resistive computer load, resistive load, inductive brush load, light dimmer load, light dimmer resistive load, and variable speed motor load.

33. The system of claim 30 wherein said controller selects one of a plurality of load types, including compressor load, computer load, resistive computer load, resistive load, inductive brush load, light dimmer load, light dimmer resistive load, and variable speed motor load.

34. The system of claim 25 wherein said controller selects one of a plurality of load types, including compressor load, computer load, resistive computer load, resistive load, inductive brush load, light dimmer load, light dimmer resistive load, and variable speed motor load.

35. The system of claim 31 wherein said controller designates one of said load types as a default selection in the absence of a determination that one of said other load types is present.

36. The system of claim 32 wherein said controller increments and decrements said one or more of said plurality of counters in a different fashion for each of said load types.

37. The system of claim 25 wherein said controller increments and decrements a separate one or more of said counters for each type of load.

38. The system of claim 37 wherein said controller further increments and decrements a load type counter not associated with any of said specified load types in a predetermined fashion in response to said sensor signal and said output signal.

39. The system of claim 33 wherein said controller increments and decrements a separate one or more of said counters for each type of load.

40. The system of claim 24 wherein said controller determines whether an arcing fault is present using the states of selected ones of said plurality of counters for determining the presence of selected sub-harmonics in the current.

41. A controller for a system for determining whether arcing is present in an electrical circuit in response to input signals, said input signals corresponding to a changing current in said circuit, to an analysis of a line current at a sub-harmonic level, and to the presence of broadband noise in a predetermined range of frequencies in said circuit, said controller comprising:

a plurality of counters;

means for incrementing and decrementing said plurality of counters in accordance with said input signals;

means for determining a type of load connected to said electrical circuit using at least the states of one or more of said plurality of counters; and means for determining whether a fault is present using at least the states of said plurality counters.

42. The controller of claim 41 and further including means for producing a trip signal in response to a determination that an arcing fault is present in said circuit.

43. The controller of claim 41 wherein said counters are implemented in software.

44. The controller of claim 41 wherein said means for determining whether an arcing fault is present also uses the type of load determined to be connected to said electrical circuit.

45. The controller of claim 41 wherein said means for incrementing and decrementing is responsive to the type of load determined to be connected to said electrical circuit.

46. The controller of claim 41 wherein said means for determining a type of load includes means for selecting one of a plurality of load types, including compressor load, computer load, resistive computer load, resistive load, inductive brush load, light dimmer load, light dimmer resistive load, and variable speed motor load.

47. The controller of claim 44 wherein said means for determining a type of load includes means for selecting one of a plurality of load types, including compressor load, computer load, resistive computer load, resistive load, inductive brush load, light dimmer load, light dimmer resistive load, and variable speed motor load.

48. The controller of claim 45 wherein said means for determining a type of load includes means for selecting one of a plurality of load types, including compressor load, computer load, resistive computer load, resistive load, inductive brush load, light dimmer load, light dimmer resistive load, and variable speed motor load.

49. The controller of claim 46 and further including means for designating one of said load types as a default selection in the absence of a determination of one of said other load types.

50. The controller of claim 46 wherein said means for incrementing and decrementing operates in a different fashion for each of said load types.

51. The controller of claim 46 wherein said means for incrementing and decrementing, increments and decrements a separate one or more of said counters for each of said load types.

52. The controller of claim 46 further including means for incrementing and decrementing a load type counter not associated with any of said load types.

53. The controller of claim 41 further including means for using the states of selected ones of said plurality of counters for determining the presence of selected sub-harmonics in the current.

54. The controller of claim 53 including means for incrementing and decrementing one or more said counters in response to the presence of said one or more of selected sub-harmonics.

55. A method of determining whether arcing is present in an electrical circuit in response to input signals, said input signals corresponding to a changing current in said circuit, to an analysis of a line current at a sub-harmonic level, and to the presence of broadband noise in a predetermined range of frequencies in said circuit, said method comprising:

incrementing and decrementing a plurality of counters in accordance with said input signals; and determining a type of load connected to said electrical circuit and whether an arcing fault is present using the states of said plurality of counters.

56. The method of claim 55 and further including producing a trip signal in response to a determination that an arcing fault is present in said circuit.

57. The method of claim 55 wherein said counters are implemented in software.

58. The method of claim 55 wherein said determining whether an arcing fault is present also uses the type of load determined to be connected to said electrical circuit.

59. The method of claim 55 wherein said incrementing and decrementing is responsive to the type of load determined to be connected to said electrical circuit.

60. The method of claim 55 wherein said determining a type of load includes selecting one of a plurality of load types, including compressor load, computer load, resistive computer load, resistive load, inductive brush load, light dimmer load, light dimmer resistive load, and variable speed motor load.

61. The method of claim 57 wherein said determining a type of load includes selecting one of a plurality of load types, including compressor load, computer load, resistive computer load, resistive load, inductive brush load, light dimmer load, light dimmer resistive load, and variable speed motor load.

62. The method of claim 59 wherein said determining a type of load includes selecting one of a plurality of load types, including compressor load, computer load, resistive computer load, resistive load, inductive brush load, light dimmer load, light dimmer resistive load, and variable speed motor load.

63. The method of claim 60 and further including designating one of said load types as a default selection in the absence of a determination of one of said other load types.

64. The method of claim 60 wherein said incrementing and decrementing operates in a different fashion for each of said load types.

65. The method of claim 60 wherein said incrementing and decrementing includes incrementing and decrementing a separate one or more of said counters for each of said load types.

66. The method of claim 60 further including incrementing or decrementing one or more of a load type counter not associated with any of said load types.

67. The method of claim 55 wherein further including using the states of selected ones of said plurality of counters for determining the presence of selected sub-harmonics in the current.

68. The method of claim 67 including incrementing and decrementing one or more others of said counters in response to the presence of said one or more of selected sub-harmonics.

69. The method of claim 1 wherein said analyzing and said processing are performed by a single ASIC.

70. The system of claim 21, wherein said circuit for analyzing and said controller comprise a single ASIC.

* * * * *